(12) United States Patent
Jia et al.

(10) Patent No.: US 10,989,751 B1
(45) Date of Patent: Apr. 27, 2021

(54) SYSTEM AND METHOD OF SPARSE VOLTAGE MEASUREMENT-BASED FAULT LOCATION DETERMINATION USING INTELLIGENT ELECTRONIC DEVICES

(71) Applicant: NORTH CHINA ELECTRIC POWER UNIVERSITY, Beijing (CN)

(72) Inventors: Ke Jia, Beijing (CN); Tianshu Bi, Beijing (CN); Bin Yang, Beijing (CN); Hao Liu, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/081,846

(22) Filed: Oct. 27, 2020

(51) Int. Cl.
  *G01R 31/08* (2020.01)
(52) U.S. Cl.
  CPC ......... *G01R 31/086* (2013.01); *G01R 31/088* (2013.01)
(58) Field of Classification Search
  CPC ...... G01R 31/086; G01R 31/088; G01R 1/00; G01R 3/00; G01R 15/00; G01R 19/00; G01R 21/00; G01R 22/00; G01R 27/00; G01R 29/00; G01R 31/00; G01R 33/00; G01R 35/00; G01B 5/00; G01B 7/00; G01B 17/00; G01B 21/00; G01D 3/00; G01D 5/00; G01H 9/00; G01H 11/00; G01J 1/00; G01J 3/00; G01J 5/00; G01K 1/00; G01K 3/00; G01K 5/00; G01K 7/00; G01K 11/00; G01K 15/00; G01K 2219/00; G01L 1/00; G01L 5/00; G01L 9/00; G01L 21/00; G01M 3/00; G01M 5/00; G01M 13/00; G01M 15/00; G01N 2291/00; G01N 3/00; G01N 5/00; G01N 9/00; G01N 17/00; G01N 21/00; G01N 22/00; G01N 23/00; G01N 24/00; G01N 25/00; G01N 27/00; G01N 29/00; G01N 31/00; G01N 33/00; G01N 2021/00; G01P 3/00; G01Q 10/00; G01Q 60/00; G01Q 70/00; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00;

(Continued)

(56) References Cited

PUBLICATIONS

Jia et al, Chenjie Gu, Lun Li, Zhengwen Xuan, Tianshu Bi, David Thomas. Sparse voltage amplitude measurement based fault location in large-scale photovoltaic power plants. (Year: 2017).*

(Continued)

*Primary Examiner* — Melissa J Koval
*Assistant Examiner* — Joseph O Nyamogo
(74) *Attorney, Agent, or Firm* — Hunton AK, LLP

(57) ABSTRACT

A sparse voltage measurement-based fault location determination system and method for an alternating current (AC) distribution network is described. This method can use sparse voltage measurements and Bayesian compressive sensing (BCS) algorithm to reconstruct a sparse current vector. A fault location is then determined based on the reconstructed sparse current vector. The disclosed method provides robust fault location results under a variety of asymmetrical fault scenarios. Fewer intelligent electronic devices (IEDs) allocated in the terminal buses are needed for determining the fault location; therefore, this implementation is relatively cost effective.

1 Claim, 15 Drawing Sheets

(58) Field of Classification Search
CPC ... G06F 1/00; G06F 3/00; G06F 17/00; G06F 2200/00; G06K 7/00; G06K 9/00; G06N 3/00; G06N 10/00; G06N 20/00; G06Q 1/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G11C 29/00; G21K 1/00; G16H 30/00; G16H 50/00; H01B 3/00; H01F 1/00; H01F 17/00; H01F 27/00; H01F 2017/00; H01F 2021/00; H01H 1/00; H01H 2001/00; H01H 2009/00; H01L 29/00; H01L 21/00; H01L 22/00; H01L 23/00; H01L 24/00; H01L 25/00; H01L 27/00; H01L 31/00; H01L 33/00; H01L 41/00; H01L 43/00; H01L 45/00; H01L 49/00; H01L 51/00; H01L 2223/00; H01L 2224/00; H01L 2225/00; H01L 2251/00; H01L 2924/00; H01L 2933/00; H01P 1/00; H01P 3/00; H01P 7/00; H01P 11/00; H01Q 1/00; H01Q 3/00; H01Q 9/00; H01Q 15/00; H01Q 17/00; H01Q 21/00; H01Q 25/00; H01R 4/00; H01R 9/00; H01R 12/00; H01S 3/00; H02H 1/00; H02H 7/00; H02H 3/00; H02J 1/00; H02J 3/00; H02J 4/00; H02J 7/00; H02J 9/00; H02J 13/00; H02J 2300/00; H02M 1/00; H02M 3/00; H02M 7/00; H02M 2001/00; H02M 2003/00; H02P 5/00; H02S 50/00; H03B 5/00; H03B 17/00; H03B 19/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03K 19/00; H03L 7/00; H03L 2207/00; H03M 1/00; H04B 3/00; H04B 10/00; H04B 17/00; H04L 27/00; H04N 5/00; H04N 7/00; H04R 3/00; H04R 29/00; H04W 24/00; H05B 33/00; H05B 45/00; H05B 47/10; H05H 3/00; H05K 1/00; H05K 2201/00; H05K 3/00; H05K 7/00; Y02A 30/00; Y02A 90/00; Y02B 10/00; Y02B 20/00; Y02B 70/00; Y02B 90/00; Y02E 10/00; Y02E 40/00; Y02P 70/00; Y04S 10/00; Y04S 40/00; Y04S 977/00; Y04S 277/00; Y02T 50/00; Y10T 29/00; Y10T 428/00; Y10T 307/00; Y10T 436/00

See application file for complete search history.

(56) References Cited

PUBLICATIONS

Wang Bo, Quanyuan Jiang, Yijia Cao. Transmission Network Fault Location Using Sparse PMU Measurements. (Year: 2009).*

Theodoras Alexopoulos; Milan Biswal; Sukumar M. Brahma; Mohamed El Khatib. Detection of fault using local measurements at inverter interfaced distributed energy resources (Year: 2017).*

Jia, Ke et al., "Sparse Voltage Measurement-Based Fault Location Using Intelligent Electronic Devices" IEEE Transactionon Smart Grid, vol. 11, No. 1, pp. 1-13, Jan. 2020.

* cited by examiner

SYSTEM AND METHOD OF SPARSE VOLTAGE MEASUREMENT-BASED FAULT LOCATION DETERMINATION USING INTELLIGENT ELECTRONIC DEVICES

FIELD OF THE INVENTION

The present disclosure relates generally to fault location determination and protection of power distribution system, and more particularly, to a system and method of sparse voltage measurement-based fault location determination using intelligent electronic devices.

BACKGROUND

With the development of both distribution automation (DA) and distribution management system (DMS), intelligent electronic devices (IEDs) begin to gather the operation and fault information of networks in real time, which promotes the further development of fault location methodology.

To date, fault location methods can be classified into the following categories: impedance estimation methods, travelling wave methods, and wide area measurement-based methods. Impedance estimation methods calculate the impedance using the post-fault measurement to estimate the distance between fault and observation point. These are sensitive to unpredictable laterals and load taps of the distribution networks. Travelling wave methods utilize the time of propagation and reflection of high frequency wave to evaluate the position of the fault. Wide area measurement-based methods utilize wide area measurement to locate the fault with the assistance of intelligent devices and algorithms. The influence of load change is crippled and injection of high frequency signals is avoided in wide area measurement-based methods; therefore, these have been promoted in recent years.

SUMMARY

Aspects of the disclosed technology include systems and methods of sparse voltage measurement-based fault location using intelligent electronic devices.

Embodiments of the present disclosure provide for a system for sparse voltage measurement-based fault location determination using intelligent electronic devices in an alternating current (AC) distribution network. The AC distribution network comprises: a plurality of nodes, an end node of the plurality of nodes being connected to an upper stage grid via a transformer substation; a plurality of inverter interfaced distributed generations (IIDGs), each of the plurality of IIDGs being connected to a node via a DC/AC inverter; and a plurality of intelligent electronic devices (IEDs), each of the plurality of IEDs being disposed at an end node of the plurality nodes for sampling and measuring voltage of that end node, wherein the number of the plurality of IEDs is less than the number of the plurality of nodes, such that the plurality of IEDs are sparse with respect to the plurality of nodes. The sparse voltage measurement-based fault location determination system comprises a controller in data communication with the AC distribution network, the controller configured to: determine a first negative sequence impedance matrix of the AC distribution network based on network parameters and load parameters of the AC distribution network, wherein the first negative sequence impedance matrix is obtained by reversing an admittance matrix of the AC distribution network; extract a second negative sequence impedance matrix from the first negative sequence impedance matrix based on allocations of the plurality of IEDs, wherein the number of rows of the second negative sequence impedance matrix equals the number of the plurality of IEDs; determine a negative sequence impedance amplitude matrix from the second negative sequence impedance matrix, wherein each element of the negative sequence impedance amplitude matrix is an amplitude value of each corresponding element of the second negative sequence impedance matrix; when a fault is detected to have occurred in the AC distribution network, determine a negative sequence voltage vector, each element of the negative sequence voltage vector being a voltage of a node at which one of the plurality of IEDs is disposed, and the voltage of the node being sampled and measured by the corresponding IED at a specified sampling frequency over a specified time period; determine a negative sequence voltage amplitude vector from the negative sequence voltage vector by calculating an amplitude of each voltage in the negative sequence voltage vector; perform a Bayesian compressive sensing (BCS) operation on the negative sequence impedance amplitude matrix and the negative sequence voltage amplitude vector to obtain a reconstructed negative sequence current vector, wherein each element of the reconstructed negative sequence current vector is a virtual current at a node of the plurality of nodes, each element of the reconstructed negative sequence current vector is an amplitude value of a corresponding current, and the reconstructed negative sequence current vector has few nonzero elements such that the reconstructed negative sequence current vector is a sparse vector; identify two nodes corresponding to the first two largest elements in the reconstructed negative sequence current vector; and determine the fault to have occurred between the two nodes corresponding to the first two largest elements.

Embodiments of the present disclosure provide for a method for sparse voltage measurement-based fault location determination using intelligent electronic devices in an AC distribution network. The AC distribution network comprises: a plurality of nodes, an end node of the plurality of nodes being connected to an upper stage grid via a transformer substation; a plurality of inverter interfaced distributed generations (IIDGs), each of the plurality of IIDGs being connected to a node via a DC/AC inverter; and a plurality of intelligent electronic devices (IEDs), each of the plurality of IEDs being disposed at an end node of the plurality nodes for sampling and measuring voltage of that end node, wherein the number of the plurality of IEDs is less than the number of the plurality of nodes, such that the plurality of IEDs are sparse with respect to the plurality of nodes, and a controller in data communication with the AC distribution network. The sparse voltage measurement-based fault location determination method comprises: determining, by the controller, a first negative sequence impedance matrix of the AC distribution network based on network parameters and load parameters of the AC distribution network, wherein the first negative sequence impedance matrix is obtained by reversing an admittance matrix of the AC distribution network; extracting, by the controller, a second negative sequence impedance matrix from the first negative sequence impedance matrix based on allocations of the plurality of IEDs, wherein the number of rows of the second negative sequence impedance matrix equals the number of the plurality of IEDs; determining, by the controller, a negative sequence impedance amplitude matrix from the second negative sequence impedance matrix, wherein each element of the negative sequence impedance amplitude matrix is an amplitude value of each corresponding element of the second negative sequence impedance matrix; when a fault is detected to have occurred in the AC distribution network, determining, by the controller, a negative sequence voltage vector, each element of the negative sequence voltage vector being a voltage of a node at which one of the plurality of IEDs is disposed, and the voltage of the node being sampled and measured by the corresponding IED at a specified sampling frequency over a specified time period; determining, by the controller, a negative sequence voltage amplitude vector from the negative sequence voltage vector by calculating an amplitude of each voltage in the negative sequence voltage vector; performing, by the controller, a Bayesian compressive sensing (BCS) operation on the negative sequence impedance amplitude matrix and the negative sequence voltage amplitude vector to obtain a reconstructed negative sequence current vector, wherein each element of the reconstructed negative sequence current vector is a virtual current at a node of the plurality of nodes, each element of the reconstructed negative sequence current vector is an amplitude value of a corresponding current, and the reconstructed negative sequence current vector has few nonzero elements such that the reconstructed negative sequence current vector is a sparse vector; identifying, by the controller, two nodes corresponding to the first two largest elements in the reconstructed negative sequence current vector; and determining, by the controller, the fault to have occurred between the two nodes corresponding to the first two largest elements.

Further features of the disclosed systems and methods, and the advantages offered thereby, are explained in greater detail hereinafter with reference to specific example embodiments illustrated in the accompanying drawings.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
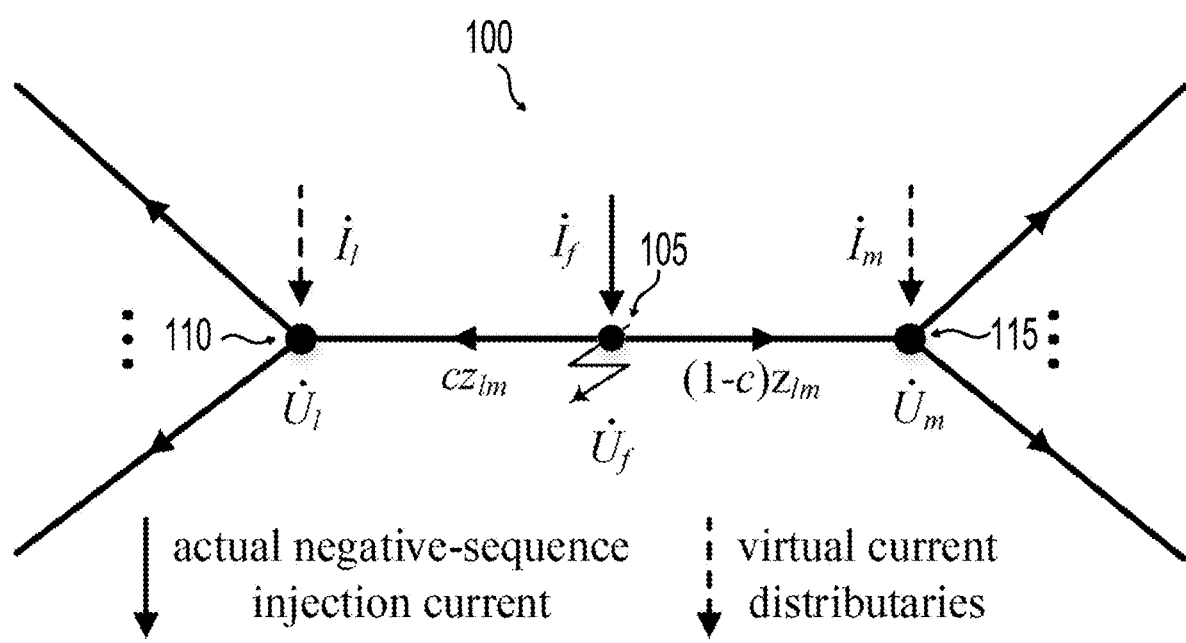
FIG. 1 shows an example negative sequence current equivalent injection according to an embodiment of the present disclosure.

Exemplary embodiments of the invention will now be described in order to illustrate various features of the invention. The embodiments described herein are not intended to be limiting as to the scope of the invention, but rather are intended to provide examples of the components, use, and operation of the invention. The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Embodiments of this invention disclose a fault-section location system and method based on sparse measurements, which may be aimed at asymmetrical faults. A virtual current vector is defined to indicate the faulted section, which is sufficiently sparse except that the fault position corresponding entries are nonzero. To simplify the algorithm of the fault-section location system and method, the virtual current vector may be fixed by amplitudes of voltages and impedances, and the feasibility of which is demonstrated. In this disclosure, the Bayesian Compressive Sensing theory can be employed to reduce the number of required intelligent electronic devices (IEDs). In addition, the minimal number of IEDs and their allocation are described in the example embodiments. The performance of the disclosed system and method can be validated, for example, in a 69-bus, 12.66 kV distribution system with six distributed generations (DGs) in response to various fault scenarios. The simulation results can show that the fault-section location system and method disclosed herein are robust for single-phase, double-phase, and double-phase to ground faults with high resistance under noisy conditions. Furthermore, the fault-section location system and method may be applicable to networks with inverter interfaced DGs.

I. Introduction

Wide area measurement-based methods determine the faulted area using the synchronous fault information gathered from several measurements. For example, a fault location may be obtained by monitoring voltage sags at different nodes. It is necessary to simulate different fault scenarios and then compare the simulation results with the measured voltages to select the optimal match. Voltage sag methods can be combined with impedance estimation methods, which may effectively decrease "pseudo" impedance estimations, and provide a systematic method to induce low voltage areas. In addition, fault indicator (FI)-based methods may also be employed conventionally. The faulted area determined by these above-mentioned methods may rely on the position of the monitoring device. Insufficient investment would definitely increase the range of the determined faulted area, thus increasing troubleshooting time.

IEC 61850, published in 2003, specifies the communication system for power utility automation. Since then, efforts to improve the fault location function of DMS have been made. However, over investment in IED leads to costly deployment and high bandwidth communication networks.

The fault location performance may be improved using synchronous phasors, measured by phasor measurement units (PMUs). However, the upgrading of facilities can only promote the accuracy of methods without solving the problems of the large determined range.

To solve this problem, a series of methods based on an automatic algorithm have been employed. The introduction of the intelligent algorithm may decrease the operation time, but the algorithm's pre-training and modification to various conditions requires considerable unavailable data. The methods based on iterative state estimation may be universal but cause high computational burden. Additionally, fault location methods based on probability theory can be employed, which may inspire research on automatic fault location methods.

Embodiments of the present invention disclose a sparse voltage measurement-based fault-section location determination system and method aimed at asymmetrical faults in distribution networks (three-phase faults rarely happen in a distribution system), which can narrow the location range down to two adjacent nodes by few IEDs. A defined sparse vector, whose items are a virtual nodal current injection of negative sequence, is presented as substitute for the true fault current to indicate the faulted section. The virtual current vector is obtained via an operation of multiplying the negative sequence node voltage vector with the negative sequence admittance matrix. Given that the purpose of the operation is to obtain an index vector instead of a real current phasor, the operation can be simplified by using the amplitudes of voltage and admittance to reconstruct the target current vector, and the feasibility analysis of which is presented. The equations are underdetermined due to the sparsity of measured voltages. To calculate the fault injection current vector, Bayesian Compressive Sensing (BCS) theory may be used. The fault location system and method disclosed herein are tested in a 69-bus, 12.66 kV distribution system with six distributed generations (DGs) built in Power Systems Computer Aided Design (PSCAD)/Electromagnetic Transients with DC Analysis (EMTDC) according to actual distribution networks. Simulation results show that the disclosed system and method offer good accuracy, adaptation to noise, and large fault resistance. Furthermore, the disclosed system and method can be available to distribution networks with inverter interfaced DGs. Via both experiments and analysis, the minimal number of IEDs can be determined by gross nodes quantity and non-zero entries of the index vector. The allocation of IEDs is also discussed.

Compared to conventional wide area measurement-based methods, the advantages offered by the system and method disclosed herein may include, but not limited to: the disclosed method is capable of identifying the faulted line section from a large scale high- or middle-voltage (above 10 kV) distribution network, using measurements gathered from very few measuring devices; the requirement of the disclosed method for IEDs is far less than that of the conventional methods; allocation of IEDs has been analyzed in this disclosure; negative voltage amplitudes extracted from the original sampling, instead of the voltage phasors, are processed to locate the fault section; the post-fault voltage data and network parameters required in the method are obtainable; the disclosed method can avoid the polling of unavailable data and the investment of PMU; an efficient algorithm BCS can be adopted to facilitate obtaining the position of the fault, which demonstrates improved applicability and anti-noise performance; the operation time of the disclosed algorithm in this method only scores ms in a real time digital simulator (RTDS); compared to computationally burdensome conventional methods, the fault location time is reduced; and the negative sequence component is used in the disclosed method, which makes the fault location result less affected by DG, and which normally uses eliminating negative sequence control to maintain a smooth fault ride.

II. Fault-Section Location Determination Methodology

When a permanent asymmetrical shunt fault has occurred in a distribution network, the negative sequence component of the fault current cannot be directly used to indicate the fault position because the post-fault structure is unknown. Therefore, a virtual current vector may be used to indicate the fault position.

A. Virtual Negative Sequence Injection Current

In an example as shown in FIG. 1, given an N-nodes distribution network 100, an asymmetric fault 105 is assumed to have occurred on a line l-m (i.e., from node l indicated by 110 to node m indicated by 115), which is away from the node l by c/l length of the line l-m (0≤c≤1). The parameters, such as impedance/admittance, of lines in the network 100 are assumed to distribute evenly. The actual negative sequence current, as shown in FIG. 1, is presented as a solid arrow.

According to Kirchhoff's Current Law (KCL), the sum of the actual negative sequence current at each of the nodes l and m is zero. This relationship of currents can be represented via nodal negative sequence voltages as shown in equation (1):

$$\sum_{i \neq l \text{ and } i \neq m}^{n} y_{li}(\dot{U}_l - \dot{U}_i) + y_l(\dot{U}_l - 0) + y_{lm}(\dot{U}_l - \dot{U}_f)/c = 0 \quad (1)$$

$$\sum_{i \neq l \text{ and } i \neq m}^{n} y_{mi}(\dot{U}_m - \dot{U}_i) + y_m(\dot{U}_m - 0) + \frac{y_{lm}(\dot{U}_m - \dot{U}_f)}{(1-c)} = 0$$

where $y_{li}$ represents an admittance between the node l and each node (represented by letter i) connected to the node l, $y_{mi}$ represents an admittance between the node m and each node (represented by letter i) connected to the node m, $y_{lm}$ represents the admittance of line l-m, $y_l$ is the admittance of a load connected to the ground at the node l, $y_m$ is the admittance of a load connected to the ground at the node m, and $\dot{U}_i$ is the negative sequence voltage of node i in phasor form. As mentioned above, the exact position of the fault is unknown. Therefore, it is difficult to obtain the actual $\dot{I}_f$. Equivalently, it can be substituted by two virtual components $\dot{I}_l$ and $\dot{I}_m$, i.e., the dashed arrows in FIG. 1, separately injected into the nodes l and m.

The transformation (i.e., substituting $\dot{I}_f$ with $\dot{I}_l$ and $\dot{I}_m$) cannot change the rest of the distribution network 100; therefore, the negative sequence current injections of other nodes remain zero. On this basis, the post-fault topology of the system 100 can be taken as identical to the pre-fault; consequently, virtual negative sequence currents can reasonably be fixed by pre-fault system parameters and post-fault nodal negative sequence voltages as shown in equations (2-a) and (2-b):

$$\dot{I} = Y \cdot \dot{U} \quad (2\text{-a})$$

$$\begin{bmatrix} \dot{I}_1 \\ \vdots \\ \dot{I}_l \\ \dot{I}_m \\ \vdots \\ \dot{I}_N \end{bmatrix}_{N \times 1} = \begin{bmatrix} Y_{11} & \cdots & Y_{1l} & Y_{1m} & \cdots & Y_{1N} \\ \vdots & & \vdots & \vdots & & \vdots \\ Y_{l1} & \cdots & Y_{ll} & Y_{lm} & \cdots & Y_{lN} \\ Y_{m1} & \cdots & Y_{ml} & Y_{mm} & \cdots & Y_{mN} \\ \vdots & & \vdots & \vdots & & \vdots \\ Y_{N1} & \cdots & Y_{Nl} & Y_{Nm} & \cdots & Y_{NN} \end{bmatrix}_{N \times N} \begin{bmatrix} \dot{U}_1 \\ \vdots \\ \dot{U}_l \\ \dot{U}_m \\ \vdots \\ \dot{U}_N \end{bmatrix}_{N \times 1} \quad (2\text{-b})$$

where $\dot{I}$ represents the virtual nodal negative sequence currents vector in phasor, $\dot{U}$ represents the nodal negative sequence voltages vector in phasor, and Y represents the negative-sequence admittance matrix of pre-fault networks. The relationship between the entries in Y and the admittance in the equation (1) may be expressed as equation (3):

$$\begin{cases} Y_{kk} = y_k + \sum_{i \neq k}^{n} y_{ki} \\ Y_{jk} = -y_{jk} = Y_{kj} \end{cases} \quad (3)$$

where $Y_{kk}$ represents the diagonal elements in Y, $Y_{jk}$ and $Y_{kj}$ are the non-diagonal elements in Y, $$\sum_{i \neq k}^{n} y_{ki}$$

is the sum of admittances of branches connected to node k, $y_k$ is the admittance of the load connected to ground at the node k, and $y_{jk}$ is the admittance of the line j-k (i.e., from the node j to the node k). Regarding the two virtual currents (negative sequence), i.e. the dashed arrows in FIG. 1, these can be seen as two independent current-sources with unknown amplitudes.

Based on the equations (2-b) and (3), the virtual current $\dot{I}_l$ can be represented as equation (4):

$$\dot{I}_l = \sum_{i=1}^{n} Y_{li} \dot{U}_i \quad (4)$$

$$= \left( y_l + \sum_{i \neq l}^{n} y_{li} \right) \dot{U}_l + \sum_{i \neq l}^{n} (-y_{li} \dot{U}_i)$$

$$= \left[ \sum_{i \neq l \text{ and } i \neq m}^{n} -Y_{li}(\dot{U}_l - \dot{U}_i) \right] - Y_{lm}(\dot{U}_l - \dot{U}_m) + \left( Y_{ll} + \sum_{i \neq l}^{n} Y_{li} \right) \dot{U}_l$$

In the same way, $\dot{I}_m$ can be represented as equation (5):

$$\dot{I}_m = \left[ \sum_{i \neq l \text{ and } i \neq m}^{n} -Y_{mi}(\dot{U}_m - \dot{U}_i) \right] - Y_{ml}(\dot{U}_m - \dot{U}_l) + \left( Y_{mm} + \sum_{i \neq m}^{n} Y_{mi} \right) \dot{U}_m \quad (5)$$

Integrating the equation (1) with the equations (4) and (5), $\dot{I}_l$ and $\dot{I}_m$ can be deduced as equation (6):

$$\begin{cases} \dot{I}_l = -Y_{lm}(\dot{U}_l - \dot{U}_m) - y_{lm}(\dot{U}_l - \dot{U}_f)/c \\ \dot{I}_m = -Y_{lm}(\dot{U}_m - \dot{U}_l) - y_{lm}(\dot{U}_m - \dot{U}_f))/(1-c) \end{cases} \quad (6)$$

The coefficient c varies with changing fault positions. If the value of c ranges between 0 and 1, the fault position is between nodes l and m; however, if c is equal to 0 or 1, the fault occurred on the nodes l or m. This can be summarized as equation (7):

$$\begin{cases} \dot{I}_l \neq 0, \dot{I}_m \neq 0, \dot{I}_j = 0 & (0 < c < 1, j \neq l \text{ and } m) \\ \dot{I}_l \neq 0, \dot{I}_m = 0, \dot{I}_j = 0 & (c = 0, j \neq l \text{ and } m) \\ \dot{I}_l = 0, \dot{I}_m \neq 0, \dot{I}_j = 0 & (c = 1, j \neq l \text{ and } m) \end{cases} \quad (7)$$

In this example, a vector comprising $\dot{I}_l$, $\dot{I}_m$ and $\dot{I}_j$ is a fictitious current vector, which may be referred to as $\dot{I}_F$.

IEDs may not be allocated on every bus in the distribution networks. Therefore, the measurement $\dot{U}$ is sufficiently sparse. The voltages of measurable buses can be extracted from $\dot{U}$ to form a new vector $\dot{U}_M$. Accordingly, the corresponding rows of the impedance matrix (the inverse of Y) can be extracted to form a new matrix $Z_M$. Consequently, the virtual current vector $\dot{I}_F$ can then be obtained by equations (8-a) and (8-b):

$$\dot{U}_M = Z_M \cdot \dot{I}_F \quad (8\text{-a})$$

$$\begin{bmatrix} \dot{U}_{i_1} \\ \dot{U}_{i_2} \\ \vdots \\ \dot{U}_{i_M} \end{bmatrix}_{M \times 1} = \begin{bmatrix} Z_{i_1 1} & Z_{i_1 2} & \cdots & Z_{i_1 N} \\ Z_{i_2 1} & Z_{i_2 2} & \cdots & Z_{i_2 N} \\ \vdots & \vdots & & \vdots \\ Z_{i_M 1} & Z_{i_M 2} & \cdots & Z_{i_M N} \end{bmatrix}_{M \times N} \begin{bmatrix} 0 \\ \vdots \\ \dot{I}_l \\ \dot{I}_m \\ \vdots \\ 0 \end{bmatrix}_{N \times 1} \quad (8\text{-b})$$

where N represents the gross number of nodes within the distribution network and M represents the number of IEDs.

Only if elements of the vectors are phasors, the equation (i.e., (8-b)) holds. However, PMUs are too expensive to be used in distribution networks. Therefore, the feasibility of using amplitudes is demonstrated in the next subsection B.

B. Negative Sequence Equation with Amplitude Elements

In this example, to avoid phasor calculation and rigorous synchronization of the gathered data, this subsection analyzes the feasibility of substituting phasors with their magnitudes based on the property of the bus impedance matrix.

Figure 2:
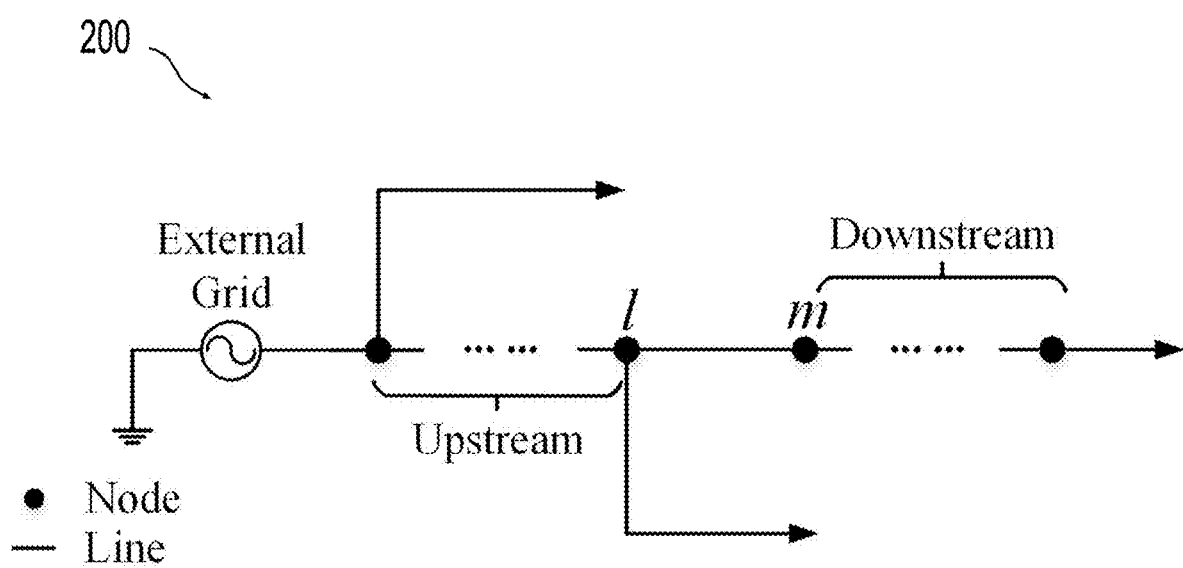
FIG. 2 shows an example distribution network with portioned regions according to an embodiment of the present disclosure.

The branches in the network model can be classified into two types: 1) tree branches, for example, all distribution lines can be regarded as tree branches due to the radial topology of the distribution networks; 2) link branches, for example, the loads and DGs can be taken as link branches. In the case presented in subsection II-A above, it is assumed that node 1 is closer to the external grid, the region among them is defined as upstream, and the region behind node m is defined as downstream, which is shown as an example network 200 in FIG. 2.

According to the fundamental of modifying an impedance matrix by adding a branch, the modifications of tree and link branches are different.

After addition of a tree branch l-m at the node l, the impedance matrix $Z^l$ is modified into $Z^m$, as shown in equation (9). The relationships among the elements in $Z^m$ are: $Z_{mi}=Z_{li}$, $Z_{im}=Z_{il}$, $Z_{mm}=Z_{ll}+z_{lm}$, where $z_{lm}$ represents the impedance of line l-m and the letter i represents the upstream nodes.

$$Z^l = \begin{bmatrix} Z_{11} & \cdots & Z_{1l} \\ \vdots & & \vdots \\ Z_{l1} & \cdots & Z_{ll} \end{bmatrix}_{l \times l} \xrightarrow{\text{Addition of line } l\text{-}m} Z^m = \quad (9)$$

$$\begin{bmatrix} Z_{11} & \cdots & Z_{1l} & Z_{1m} \\ \vdots & & \vdots & \vdots \\ Z_{l1} & \cdots & Z_{ll} & Z_{lm} \\ Z_{m1} & \cdots & Z_{ml} & Z_{mm} \end{bmatrix}_{m \times m}$$

Similarly, after adding a tree branch downstream, the relationships of the elements in the new matrix are: $Z_{jl}=Z_{ml}$, $Z_{jm}=Z_{mm}$, $Z_{ij}=Z_{il}$, where the letter j represents the downstream nodes. The property can be summarized as equation (10):

$$\frac{Z_{ll}}{Z_{ln}} = \frac{Z_{il}}{Z_{im}} \ne \frac{Z_{ml}}{Z_{mm}} = \frac{Z_{jl}}{Z_{jm}} \ne \frac{Z_{ll}}{Z_{lj}} = \frac{Z_{il}}{Z_{ij}} \quad (10)$$

where i≤l, the letter represents upstream nodes, j≥m, the letter represents downstream nodes.

While adding a link branch does not change the dimension of Z, it can only lead to changes in the values of the entries relevant for downstream. For example, regarding a load connected at a node x, this link branch can be considered as a branch link between the node x and ground defined as the node zero. Therefore, the modification of relevant downstream entries $Z_{ij}$ is as shown in equation (11):

$$\overline{Z}_{ij} = Z_{ij} - \frac{(Z_{ix}-Z_{i0})(Z_{xj}-Z_{0j})}{Z_{xx}+Z_{00}-2Z_{x0}+z_{x0}} \quad (11)$$

where $\overline{Z}_{ij}$ represents the modified element $Z_{ij}$, i, j≥x, number 0 represents the node zero representing ground, and $z_{x0}$ represents the equivalent impedance of the load. According to the definition of self-impedance and mutual-impedance, $Z_{i0}=Z_{0j}=Z_{00}=Z_{x0}=0$. Therefore, (11) can be simplified as equation (12):

$$\overline{Z}_{ij} = Z_{ij} - \frac{Z_{ix}Z_{xj}}{Z_{xx}+z_{x0}} = Z_{ij} - \frac{Z_{ix}Z_{xj}}{K} \quad (12)$$

where $K=Z_{xx}+z_{x0}$. The following investigates whether the first equation of (10) still holds after addition of a link branch. Suppose this proposition holds, which means:

$$\frac{\overline{Z}_{ll}}{\overline{Z}_{ln}} = \frac{\overline{Z}_{il}}{\overline{Z}_{im}} \quad (13\text{-a})$$

$$\frac{Z_{ll} - \frac{Z_{lx} \times Z_{xl}}{K}}{Z_{lm} - \frac{Z_{lx} \times Z_{xm}}{K}} = \frac{Z_{il} - \frac{Z_{ix} \times Z_{xl}}{K}}{Z_{im} - \frac{Z_{ix} \times Z_{xm}}{K}} \quad (13\text{-b})$$

The equation (13-b) then becomes equation (14):

$$(Z_{ll}Z_{im}-Z_{lm}Z_{il})K^2 - (Z_{ll}Z_{ix}Z_{xm}+Z_{lx}Z_{xl}Z_{im}-Z_{lm}Z_{ix}Z_{xl} - Z_{lx}Z_{xm}Z_{il})K + Z_{lx}Z_{xl}Z_{ix}Z_{xm} - Z_{lx}Z_{xm}Z_{ix}Z_{xl} = 0 \quad (14)$$

where $Z_{ll}Z_{im}-Z_{lm}Z_{il}=0$ can be known from the first equation in (10). Therefore, if the second item of (14) was zero, the proposition would hold. If the node x was in upstream, then equation (15) can be obtained:

$$Z_{ix}(Z_{ll}Z_{xm}-Z_{lm}Z_{xl})+Z_{lx}(Z_{xl}Z_{im}-Z_{xm}Z_{il})=0 \quad (15)$$

If the node x was in downstream, then equation (16) can be obtained:

$$Z_{ix}(Z_{ll}Z_{xm}-Z_{lm}Z_{xl})+Z_{lx}(Z_{xl}Z_{im}-Z_{xm}Z_{il})=0 \quad (16)$$

Integrated with (10), the items in parentheses of (15) and (16) are equal to zero. Therefore, this demonstrates the proposition stands, which is the first equation of (10), still holds after addition of a link branch. The other two equations of (10) can also be verified in the same way.

In conclusion, the relationships among entries of matrix Z can be drawn as:

$$k_1 = \frac{Z_{ll}}{Z_{ln}} = \frac{Z_{il}}{Z_{im}} \ne \frac{Z_{ml}}{Z_{mm}} = \frac{Z_{jl}}{Z_{jm}} = k_2 \quad (17)$$

where $k_1$ and $k_2$ are dimensionless ratios of impedance.

Therefore, the post-fault node equations implied by (8-b) can be reasonably classified as two types by the different ratios of $Z_l/Z_m$:

$$\begin{cases} \dot{U}_i = Z_{il}\dot{I}_l + Z_{im}\dot{I}_m \\ \dot{U}_j = Z_{jl}\dot{I}_l + Z_{jm}\dot{I}_m \end{cases} \Rightarrow \begin{cases} \dot{I}_{Ui} = k_1\dot{I}_l + \dot{I}_m \\ \dot{I}_{Uj} = k_2\dot{I}_l + \dot{I}_m \end{cases} \quad (18)$$

where $\dot{U}_i$ represents the voltage of upstream node, $\dot{U}_j$ is the voltage of downstream node, $\dot{I}_{Ui}=\dot{U}_i/Z_{im}$ and $\dot{I}_{Uj}=\dot{U}_j/Z_{jm}$. It is a very legible binary linear equation group of U-I, in which the two equations are both required for solving (18). Namely, for a fault in the network, at least one IED respectively allocated in both up- and down-stream nodes could provide the solvability of (18). One fundamental of the sparse allocation of IEDs for the system and method disclosed herein is then inferred that the tail ends of all feeders should be allocated with IEDs to ensure fault location to be realized on all lines in the network.

Based on (18), a hypothesis is made that there are two scalar quantities $I^*_l$ and $I_m^*$ which make the following equations stand:

$$\begin{cases} |k_1 \dot{I}_l + \dot{I}_m| = |k_1|I^*_l + I^*_m| = |\dot{I}_{Uj}| \\ |k_2 \dot{I}_l + \dot{I}_m| = |k_2|I^*_l + I^*_m| = |\dot{I}_{Uj}| \end{cases} \quad (19)$$

Deduction of (19) seems illogical for vector calculations. However, it makes sense if the two currents are in- or out-phase. They are essentially in-phase which can be inferred from their definition, i.e. two virtual components of actual fault current. Therefore, the hypothesis is founded. Hereto, the mathematical model for fault location has been built as:

$$U_M = Z_M \cdot I^*_F \quad (20\text{-a})$$

$$\begin{bmatrix} |\dot{U}_{i_1}| \\ |\dot{U}_{i_2}| \\ \vdots \\ |\dot{U}_{i_M}| \end{bmatrix}_{M\times 1} = \begin{bmatrix} |Z_{i_1 1}| & |Z_{i_1 2}| & \cdots & |Z_{i_1 n}| \\ |Z_{i_2 1}| & |Z_{i_2 2}| & \cdots & |Z_{i_2 n}| \\ \vdots & \vdots & & \vdots \\ |Z_{i_M 1}| & |Z_{i_M 2}| & \cdots & |Z_{i_M n}| \end{bmatrix}_{M\times n} \begin{bmatrix} 0 \\ \vdots \\ I^*_l \\ I^*_m \\ \vdots \\ 0 \end{bmatrix}_{n\times 1} \quad (20\text{-b})$$

Defining the vector $I^*_F = [0 \ldots I^*_l \, I^*_m \ldots 0]^T$ as the fault position indicator, is able to be fixed by processing root mean square (RMS) of the measured negative sequence voltages and amplitudes of impedances. The two nonzero entries in $I^*_F$ intuitively indicate the faulted section.

Solving the binary linear equation group (19) would not be straightforward as it looks like. Since the positions of l and m are inconclusive, the $\dot{I}_{Ui}$ and $\dot{I}_{Uj}$ cannot be certain (e.g. $\dot{U}_i/Z_{im}$ in which the denominator $Z_{im}$ is related to the position of node m). Finding the positions of l and m is an optimization problem, so BCS has been introduced into the disclosed method in this example.

C. Solving Process Based on BCS Theory

In this example, the Bayesian compressive sensing theory based on Sparse Bayesian Learning (SBL) may be more suitable than traditional theories based on $l_1$-norm regularization formulation. The reason is that these deal with the perceptual matrix, which has a strong correlation between columns. Furthermore, the SBL algorithm is more inclined to obtain a sparse solution. Moreover, SBL also possesses a stronger anti-noise ability.

The fundamental of compressive sensing theory can be described as:

$$y = \Phi\theta + e \quad (21)$$

$$\hat{\theta} = \arg\min_\theta \{\|y - \Phi\theta\|_2^2 + \rho\|\theta\|_1\} \quad (22)$$

where y represents the M-dimensional measurement vector, $\Phi$ represents a M×N matrix defined as sensing matrix ($\Phi=[\phi_1, \phi_2, \ldots, \phi_N]$), $\theta$ represents the N-dimensional sparse vector to be solved, e represents the M-dimensional vector composed of Gaussian white noises, M<<N, $\|\ \|_p$ denotes the operation of computing $l_p$-norm. In the equation (22), the first item in the braces represents the constraint that the deviation between y and $\Phi\theta$ should be minimized, the second item represents the sparsity constraint (i.e. the number of nonzero elements in the vector $\theta$ should be minimized), and $\rho$ represents a coefficient with which to regulate the relationship of both items, $\rho > 0$.

In this disclosure, the objective function ((20-a) can be described as:

$$U_M = Z_M I^*_F + e \quad (23)$$

where e represents the M-dimensional vector composed of Gaussian white noises of voltages measurements.

For the initialization of the SBL algorithm, every entry $\theta_i$ in $\theta$ is assumed to obey a Gauss distribution, thus y's Gauss likelihood (GL) model with unknown variance $\sigma^2$ can be obtained:

$$p(y \mid \theta, \sigma^2) = (2\pi\sigma^2)^{-K/2} \exp\left(\frac{1}{2\sigma^2}\|y - \Phi\theta\|^2\right) \quad (24)$$

where $\sigma^2$ represents the variance of y's GL model. Equation (24) is a multiple linear regression in which y is given to estimate $\theta$ and $\sigma^2$.

Unlike Laplace Sparseness Prior (LSP), the hierarchical prior based on Relevance Vector Machine (RVM) used in SBL is conjugated to the GL model. The conjugation property greatly reduces the complexity of the algorithm. Hierarchical prior based on RVM is introduced in the following.

It is assumed that every element in sparse vector $\theta$ is independent, and obeys Gauss distribution with zero mean:

$$p(\theta \mid \alpha) = \prod_{i=1}^{N} N(\theta_i \mid 0, \alpha_i^{-1}) \quad (25)$$

where $\alpha_i$ is defined as the precision of Gaussian density function, i.e. the reciprocal of variance. Hyper-parameter $\alpha$ is assumed to obey a gamma prior distribution:

$$p(\alpha \mid a, b) = \prod_{i=1}^{N} \Gamma(\alpha_i \mid a, b) \quad (26)$$

where a and b represent the hyper-parameters of the parameter model of $\alpha$. Marginalizing $\alpha$ obtains the prior distribution of $\theta$:

$$p(\theta \mid a, b) = \prod_{i=1}^{N} \int_0^\infty N(\theta_i \mid 0, \alpha_i^{-1}) \Gamma(\alpha_i \mid a, b) d\alpha_i \quad (27)$$

Considering $\theta_i$ as measurement data and $N(\theta_i|0,\alpha_i^{-1})$ as the likelihood function of $\theta_i$, $\Gamma(\alpha_i|a, b)$ is conjugate with a, in the Gauss distribution. Equation (27) satisfies a student-t distribution. The student-t distribution can be very sharp at $\theta_i=0$ if the values of a and b are given reasonably. Therefore, the prior distribution given by (27) ensures that most entries of $\theta$ are 0; namely, the sparsity of the reconstructed signal is ensured. It is assumed that the reciprocal of the noise variance $\beta=\sigma^{-2}$, obeys the Gamma prior distribution, i.e. $p(\beta|c,d)=\Gamma(\beta|a,b)$, where c and d are hyper-parameters.

Integrated with the discussion of the measurement data y and the above-mentioned prior distribution, the posterior distribution can be derived from the Bayes formula as follows:

$$p(\theta,\alpha,\sigma^2|y)=p(\theta|y,\alpha,\sigma^2)p(\alpha,\sigma^2|y) \quad (28)$$

The posterior density function consists of two parts in which the first term $p(\theta|y,\alpha,\sigma^2)$ is a multi-dimensional Gaussian distribution whose mean and variance are:

$$\mu=\sigma^{-2}\Sigma\Phi^T y \quad (29)$$

$$\Sigma(\sigma^{-2}\Phi^T\Phi+A)^{-1} \quad (30)$$

where $A=\text{diag}(\alpha_1, \alpha_2 \ldots \alpha_N)$.

The second term $p(\alpha,\sigma^2|y)$ is a posterior distribution of $\alpha$ and $\sigma^{-2}$. By maximizing the marginal likelihood function $p(\alpha,\sigma^2|y)$, the hyper-parameters $\alpha$ and $\sigma^{-2}$ can be estimated. Consequently, both $\alpha$ and $\sigma^{-2}$ obey the same distribution. The logarithm edge likelihood function $L(\alpha,\sigma^{-2})$ of $\alpha$ and $\sigma^{-2}$ can be described as:

$$L(\alpha, \sigma^{-2}) = \quad (31)$$
$$\log p(y|\alpha, \sigma^{-2}) = -\frac{1}{2}[M\log 2\pi + \log|C| + y^T C^{-1} y]$$

where $C=\sigma^2 E+\Phi A^{-1}\Phi^T$, and M represents the length of the measurement data.

In an example, a fast RVM algorithm may be used to greatly reduce the burden of computation and storage. It uses the independent correlations among elements of hyper-parameter $\alpha$ to decompose C into:

$$C = \sigma^2 E + \sum_{j\neq i}\alpha_j^1 \phi_j\phi_j^T + \alpha_i^{-1}\phi_i\phi_i^T = C_{-i} + \alpha_i^{-1}\phi_i\phi_i^T \quad (32)$$

where $C_{-i}$ represents the matrix after removing the ith basis vector $\phi_i$. Solving (32) through Woodbury's formula:

$$C^{-1} = C_{-i}^{-1} - \frac{C_{-i}^{-1}\phi_i\phi_i^T C_{-i}^{-1}}{\alpha_i + \phi_i^T C_{-i}^{-1}\phi_i} \quad (33)$$

Furthermore, the determinant of C is:

$$|C|=|C_{-i}||1+\alpha_i^{-1}\phi_i^T C_{-i}^{-1}\phi_i| \quad (34)$$

Substituting (34) into (31) transfers L as a function of $\alpha$:

$$L(\alpha) = -\frac{1}{2}\bigg[M\log(2\pi) + \log|C_{-i}| + y^T C_{-i}^{-1} y - \quad (35)$$
$$\log\alpha_i + \log(\alpha_i + \phi_i^T C_{-i}^{-1}\phi_i) - \frac{(\phi_i^T C_{-i}^{-1} y)^2}{\alpha_i + \phi_i^T C_{-i}^{-1}\phi_i}\bigg] =$$
$$L(\alpha_{-i}) + \frac{1}{2}\bigg[\log\alpha_i - \log(\alpha_i + s_i) + \frac{q_i^2}{\alpha_i + s_i}\bigg] = L(\alpha_{-1}) + l(\alpha_{-1})$$

$$s_i = \phi_i^T C_{-i}^{-1}\phi_i \quad (36)$$
$$q_i = \phi_i^T C_{-i}^{-1} y$$

where $s_i$ represents the sparsity factor and $q_i$ represents the mass factor. Therefore, the objective function $L(\alpha)$ is translated into the sum of $L(\alpha_{-i})$ and $l(a_i)$, both of which are independent.

The analysis of $l(\alpha_i)$ can show that $L(\alpha)$ has a unique maximum with regard to $\alpha_i$: $\alpha_i=s_i^2/(q_i^2-s_i)$ when $q_i^2>s_i$, and $\alpha_i=\infty$ when $q_i^2\leq s_i$. According to (29) and (30), $\mu$ and $\Sigma$ can be obtained, and the mean $\mu$ of the posterior estimation can be regarded as estimation of the sparse vector $\theta$. A few $\alpha_i$ converge to the finite value, and the corresponding $\theta_i$ is not 0; the remaining $\alpha_i$ will tend to infinity, and the corresponding $\theta_i$ is approximately 0.

In summary, the BCS algorithm can reconstruct a sufficiently sparse signal $\theta$, which matches reality. For the undetermined equations (20), the BCS algorithm can fix the target $I^*_F$ and the reduction of the false judgment can easily happen in traditional impedance estimation methods.

D. Fault Location Determination Steps

Figure 3:
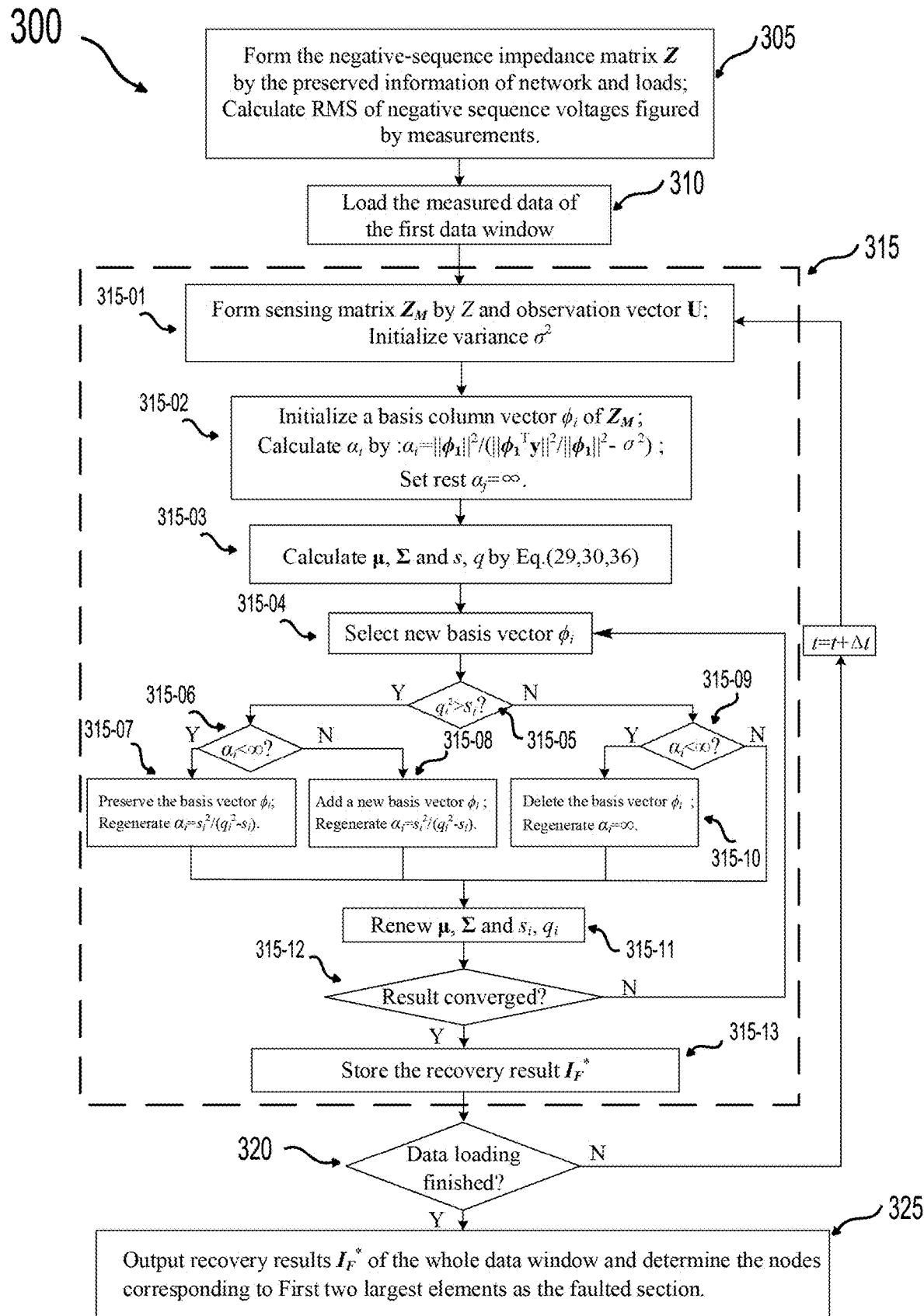
FIG. 3 shows a flow chart of a fault-section location method according to an embodiment of the present disclosure.

FIG. 3 illustrates a flow chart of a method 300 for fault section location determination in an AC distribution network according to one embodiment of the present disclosure. The AC distribution network may comprise a plurality of nodes, an end node of the plurality of nodes being connected to an upper stage grid (e.g., an external AC grid) via a transformer substation; and a plurality of inverter interfaced distributed generations (IIDGs), each of the plurality of IIDGs being connected to a node via a DC/AC inverter. The AC distribution network may further comprise a plurality of IEDs, each of which may be connected to an end node of the plurality nodes for sampling and measuring voltages of that end node. The number of the plurality of IEDs is less than the number of the plurality of nodes, such that the plurality of IEDs are sparse with respect to the plurality of nodes. For example, the number of the plurality of IEDs may be M and the number of the plurality of nodes may be N, where M<<N. A controller may be in data communication with the AC distribution network. The controller may be configured to control the plurality of IEDs, the transformer substation, and/or the DC/AC inverter. The controller may be configured to perform the steps of the fault location method disclosed herein. The method 300 may comprise the following steps.

In step 305, a negative sequence impedance matrix Z is determined based on the network and load parameters of the AC distribution network. The network and load parameters of the AC distribution network may comprise admittance of each line between every two neighboring nodes of the plurality of nodes, power of each of the loads, admittance of each line between a load and a node at which the load is connected to the AC distribution network. The negative sequence impedance matrix Z may be obtained by reversing each admittance. Each element of the negative sequence impedance matrix Z is an impedance of each line between every two neighboring nodes of the plurality of nodes.

A corresponding negative sequence impedance matrix $Z_M$ is extracted from the negative sequence impedance matrix Z according to allocations of the IEDs. The number of rows of the negative sequence impedance matrix $Z_M$ equals the number of the IEDs. Each element of a row of the negative sequence impedance matrix $Z_M$ corresponds to an impedance of a node at which an IED is disposed and an impedance of a node that is directly connected to that node at which the IED is disposed. Accordingly, the number M of the rows of the negative sequence impedance matrix $Z_M$ is significantly smaller than the number N of the negative sequence impedance matrix Z.

Further, a negative sequence impedance amplitude matrix $Z_M$ may be determined from the matrix $Z_M$. Each element of the matrix $Z_M$ is an amplitude value of each corresponding element of the matrix $Z_M$.

In this step, negative sequence voltages at the nodes at which the plurality of IEDs are disposed are sampled and measured by the corresponding IEDs at a specified sampling frequency (e.g., 4 KHz) over a specified time period (e.g., 1 ms). The number of voltage measurements equal to the number of the plurality of IEDs. In this example, the number of voltages is M, thus, a negative sequence voltage vector having M elements is determined from the voltage measurements. Further a negative sequence voltage amplitude vector can be obtained by calculating the amplitude of each voltage in the negative sequence voltage vector. Each element in the negative sequence voltage amplitude vector and negative sequence voltage vector may be an average voltage value over the specified sampling time period. For example, the average voltage value may be a RMS value. When a fault is detected to have occurred, a negative sequence voltage amplitude vector UM can be obtained based on the amplitudes of the negative sequence voltages, calculated from the measured post-fault voltages obtained from the IEDs.

In step 310, the negative sequence impedance amplitude matrix $Z_M$ and the negative sequence voltage amplitude vector UM are loaded to perform a BCS algorithm operation to reconstruct a negative sequence current vector $I^*_F$. Each element of the negative sequence current vector is the virtual current of each node of the plurality of nodes, so the dimension (i.e., the number of elements) of the negative sequence current vector is the number of the plurality of nodes. The negative sequence current vector is characterized by sparsity. That is, the negative sequence current vector determined through the BCS algorithm have significantly fewer nonzero elements. Each element of the negative sequence current vector may be an amplitude value of the corresponding current.

In step 315 as illustrated by a dotted line enclosure, the BCS algorithm is performed on the negative sequence impedance amplitude matrix $Z_M$ and the negative sequence voltage amplitude vector $U_M$. In substep 315-01, the variance $\sigma^2$ of y's GL model is initialized. In substep 315-02, a basis column vector $\phi_i$ of $Z_M$ is initialized, $\alpha_i$ is calculated by: $\alpha_i = \|\phi_1\|^2/(\|\phi_1^T y\|^2 1/\|\phi\|^2 - \sigma^2)$, the rest is set $\alpha_j = \infty$. In substep 315-03, $\mu$, $\Sigma$ and s, q are calculated by Equations (29,30,36). In substep 315-04, a new basis vector $\phi_i$ is selected. In substep 315-05, it is determine whether $q_i^2 > s_i$. In substep 315-06, when it is determine that $q_i^2 > s_i$, it is determined whether $\alpha_i < \infty$. In substep 315-07, when it is determined that $\alpha_i < \infty$, the basis vector $\phi_i$ is preserved, and $\alpha_i = s_i^2/(q_i^2 - s_i)$ is regenerated. In substep 315-08, when it is determined that $\alpha_i < \infty$ is not satisfied, a new basis vector $\phi_i$ is added, and $\alpha_i = s_i^2/(q_i^2 - s_i)$ is regenerated. In substep 315-09, when it is determine that $q_i^2 > s_i$ is not satisfied, it is determined whether $\alpha_i < \infty$. In substep 315-10, when it is determined that $\alpha_i < \infty$, the basis vector $\phi_i$ is deleted and $\alpha_i = \infty$ is regenerated. In substep 315-11, $\mu$, $\Sigma$ and $s_i$, $q_i$ are renewed. In substep 315-12, it is determined whether the result is converged. In substep 315-13, the reconstructed current results are stored.

In some embodiments, a data sampling window may comprise multiple specified sampling time periods. For example, the data sampling window may be 6 ms, and the specified sampling time period may be 1 ms, so the data sampling window can comprise 6 specified sampling time periods. The multiple specified sampling time periods may be for statistical purpose. For example, the negative sequence virtual current vectors obtained from each specified sampling time period may be averaged to obtain a final averaged negative sequence virtual current vector. Also, the negative sequence virtual current vectors obtained from each specified sampling time period may be used to cross verify to ensure the correctness of the negative sequence virtual current vectors. Thus, in step 320, the method 300 may check whether measured negative sequence voltage data for a data sampling window has all been loaded for BCS operation. If there are still voltage data, the above step 315 is repeated for the voltage amplitude data for the next sampling period until all samplings within the data window have been processed.

In step 325, the reconstructed results $\dot{I}_F^*$ of the whole data window are analyzed to determine the nodes corresponding to the first two largest elements in each reconstructed result as the faulted section. That is, the fault is determined to have occurred between the two neighboring nodes corresponding to the first two largest elements. As mentioned above, multiple sampling time periods may be included in a data sampling window, so comprehensively considering the fault location results in multiple sampling time periods can reduce misjudgment. The fault is regarded to have occurred between the two adjacent/neighboring nodes whose corresponding current elements in the reconstructed current vector are the first two largest.

III. Simulation and Experimental Tests

Figure 4:
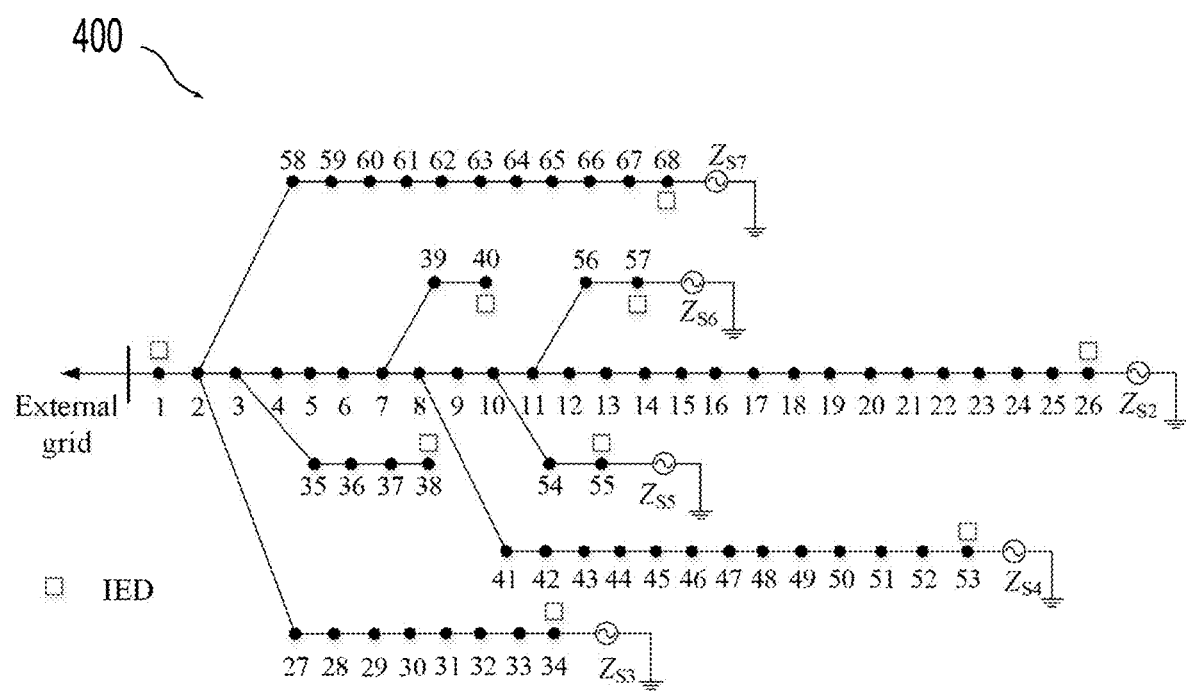
FIG. 4 shows an example diagram of a 69-nodes distribution system according to an embodiment of the present disclosure.

To validate the disclosed system and method, both simulation and experimental tests have been conducted on an Untied States Pacific Gas and Electric Company (US PG&E) 69-nodes distribution network system 400, as shown in FIG. 4. The distribution network system 400 is configured to be connected to an external grid at node 1, with a reference voltage of 12.66 kV. The detailed parameters of the distribution network system 400, such as line impedances and loads are given in Table 1.

TABLE 1 parameters of the simulation system 400

| Line | Head bus i | End bus j | Impedance of the line (p.u.) | Load at j (kVA) |
| --- | --- | --- | --- | --- |
| 1 | 1 | 2 | 0.0050 + j0.0012 | 0 |
| 2 | 2 | 3 | 0.0050 + j0.0012 | 0 |
| 3 | 3 | 4 | 0.0015 + j0.0036 | 0 |
| 4 | 4 | 5 | 0.0251 + j0.0294 | 0 |
| 5 | 5 | 6 | 0.3660 + j0.1864 | 2.6 + j2.2 |
| 6 | 6 | 7 | 0.3811 + j0.1941 | 40.4 + j30 |
| 7 | 7 | 8 | 0.0922 + j0.0470 | 75 + j54 |
| 8 | 8 | 9 | 0.0493 + j0.0251 | 30 + j22 |
| 9 | 9 | 10 | 0.8190 + j0.2707 | 28 + j19 |
| 10 | 10 | 11 | 0.1872 + j0.0691 | 145 + j104 |
| 11 | 11 | 12 | 0.7114 + j0.2351 | 145 + j104 |
| 12 | 12 | 13 | 1.0300 + j0.3400 | 8 + j5.5 |
| 13 | 13 | 14 | 1.0440 + j0.3450 | 8 + j5.5 |
| 14 | 14 | 15 | 1.0580 + j0.3496 | 0 |
| 15 | 15 | 16 | 0.1966 + j0.0650 | 45.5 + j30 |
| 16 | 16 | 17 | 0.3744 + j0.1238 | 60 + j35 |
| 17 | 17 | 18 | 0.0047 + j0.0016 | 60 + j35 |
| 18 | 18 | 19 | 0.3276 + j0.1083 | 0 |
| 19 | 19 | 20 | 0.2106 + j0.0696 | 1 + j0.6 |
| 20 | 20 | 21 | 0.3416 + j0.1129 | 114 + j81 |
| 21 | 21 | 22 | 0.0140 + j0.0046 | 5.3 + j3.5 |
| 22 | 22 | 23 | 0.1591 + j0.0526 | 0 |
| 23 | 23 | 24 | 0.3463 + j0.1145 | 28 + j20 |
| 24 | 24 | 25 | 0.7488 + j0.2457 | 0 |

TABLE 1-continued parameters of the simulation system 400

| Line | Head bus i | End bus j | Impedance of the line (p.u.) | Load at j (kVA) |
|---|---|---|---|---|
| 25 | 25 | 26 | 0.3089 + j0.1021 | 14 + j10 |
| 26 | 26 | 27 | 0.1732 + j0.0572 | 14 + j10 |
| 27 | 3 | 28 | 0.0044 + j0.0108 | 26 + j18.6 |
| 28 | 28 | 29 | 0.0640 + j0.1565 | 26 + j18.6 |
| 29 | 29 | 30 | 0.3978 + j0.1315 | 0 |
| 30 | 30 | 31 | 0.0702 + j0.0232 | 0 |
| 31 | 31 | 32 | 0.3510 + j0.1160 | 0 |
| 32 | 32 | 33 | 0.8390 + j0.2816 | 14 + j10 |
| 33 | 33 | 34 | 1.7080 + j0.5646 | 19.5 + j14 |
| 34 | 34 | 35 | 1.4740 + j0.4873 | 6 + j4 |
| 35 | 3 | 59 | 0.0044 + j0.0108 | 26 + j18.55 |
| 36 | 59 | 60 | 0.0640 + j0.1565 | 26 + j18.55 |
| 37 | 60 | 61 | 0.1053 + j0.1230 | 0 |
| 38 | 61 | 62 | 0.0304 + j0.0355 | 24 + j17 |
| 39 | 62 | 63 | 0.0018 + j0.0021 | 24 + j17 |
| 40 | 63 | 64 | 0.7283 + j0.8509 | 1.2 + j1 |
| 41 | 64 | 65 | 0.3100 + j0.3623 | 0 |
| 42 | 65 | 66 | 0.0410 + j0.0478 | 6 + j4.3 |
| 43 | 66 | 67 | 0.0092 + j0.0116 | 0 |
| 44 | 67 | 68 | 0.1089 + j0.1373 | 39.22 + j26.3 |
| 45 | 68 | 69 | 0.0009 + j0.0012 | 39.22 + j26.3 |
| 46 | 4 | 36 | 0.0034 + j0.0084 | 0 |
| 47 | 36 | 37 | 0.0851 + j0.2083 | 79 + j56.4 |
| 48 | 37 | 38 | 0.2898 + j0.7091 | 384.70 + j274.5 |
| 49 | 38 | 39 | 0.0822 + j0.2011 | 384.70 + j274.5 |
| 50 | 8 | 40 | 0.0928 + j0.0473 | 40.5 + j28.3 |
| 51 | 40 | 41 | 0.3319 + j0.1114 | 3.6 + j2.7 |
| 52 | 9 | 42 | 0.1740 + j0.0886 | 4.35 + j3.5 |
| 53 | 42 | 43 | 0.2030 + j0.1034 | 26.4 + j19 |
| 54 | 43 | 44 | 0.2842 + j0.1447 | 24 + j17.2 |
| 55 | 44 | 45 | 0.2813 + j0.1433 | 0 |
| 56 | 45 | 46 | 1.5900 + j0.5337 | 0 |
| 57 | 46 | 47 | 0.7837 + j0.2630 | 0 |
| 58 | 47 | 48 | 0.3042 + j0.1006 | 100 + j72 |
| 59 | 48 | 49 | 0.3861 + j0.1172 | 0 |
| 60 | 49 | 50 | 0.5075 + j0.2585 | 1244 + j888 |
| 61 | 50 | 51 | 0.0974 + j0.0496 | 32 + j23 |
| 62 | 51 | 52 | 0.1450 + j0.0738 | 0 |
| 63 | 52 | 53 | 0.7105 + j0.3619 | 227 + j162 |
| 64 | 53 | 54 | 1.041 + j0.5302 | 59 + j42 |
| 65 | 11 | 55 | 0.2012 + j0.0611 | 18 + j13 |
| 66 | 55 | 56 | 0.0047 + j0.0014 | 18 + j13 |
| 67 | 12 | 57 | 0.7394 + j0.2444 | 28 + j20 |
| 68 | 57 | 58 | 0.0047 + j0.0016 | 28 + j20 |

In the distribution network system 400, distributed generations are added arbitrarily at nodes 26, 34, 53, 55, 57, and 68 to simulate a multi-DGs condition. Based on the analysis in the subsection B of section II, voltage measurements are obtained from IEDs installed at nodes 1, 26, 34, 38, 40, 53, 55, 57, and 68. The voltage sampling frequency is about 4 kHz.

Figure 5:
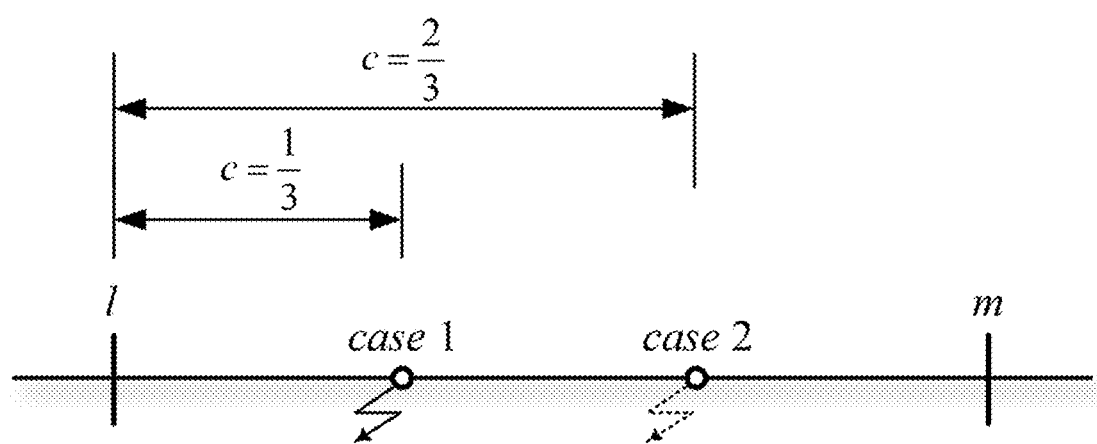
FIG. 5 shows an example diagram of different fault positions according to an embodiment of the present disclosure.

In this example, different positions of fault points on each line are shown in FIG. 5, where c represents a length percentage of distance between a fault point and a node (e.g., the node l). On each line, two fault points are set, with 134 points in total.

Figure 6:
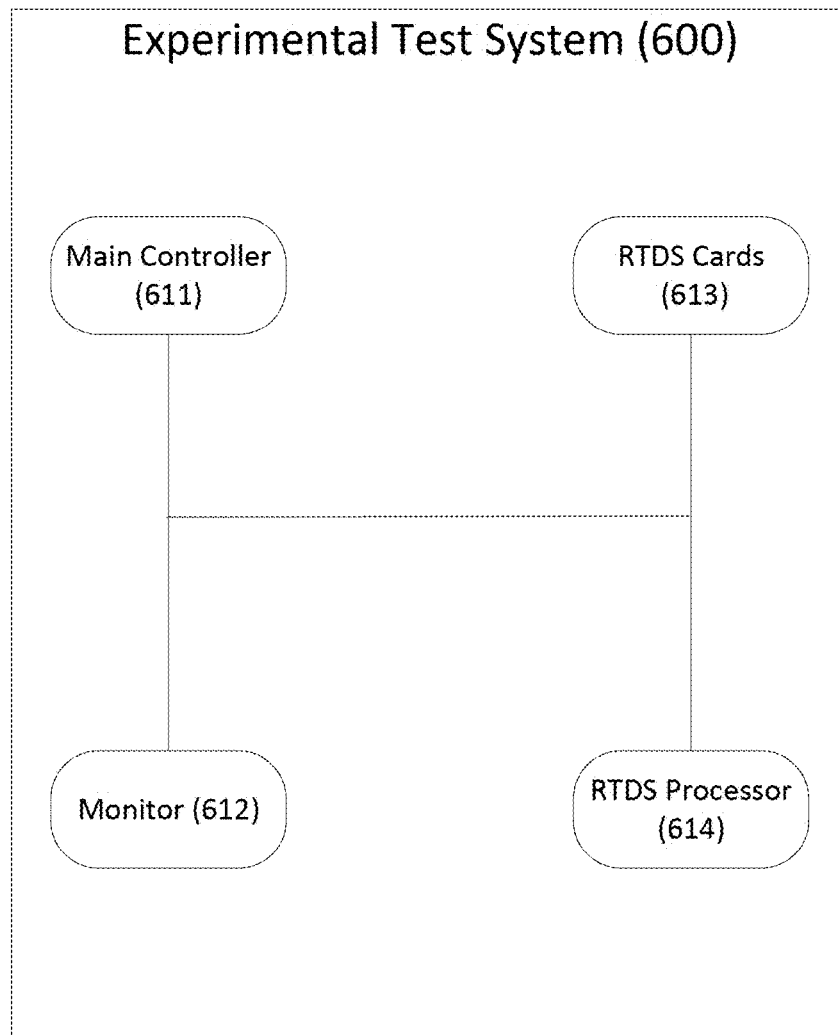
FIG. 6 shows an example experimental test system according to an embodiment of the present disclosure.

An experimental test system 600 is shown in FIG. 6. The experimental system 600 may comprise a main controller 611, a pulse width modulation (PWM) generator, monitor 612, and real time digital simulator (RTDS) including RTDS cards 613 and a RTDS processor 614. The roles of these components are known by person of ordinary skill in the art. In this example, parameters of the test model (the US PG&E 69-nodes network simulation model) are stored in the various RTDS cards 613 and the RTDS processor 614. A digital signal processor/field programmable gate array (DSP/FPGA) combined structure may be adopted in the main controller 611 to implement the fault location algorithm based on the modular programming method.

A. Influence of Fault Type and Resistance

In this subsection, the disclosed method is tested under various fault types and grounding resistances. Experimental explorations indicate that two types of location results exist: Type I, in which a faulted line section is correctly identified; and Type II, in which location is judged as the section adjacent to the faulted section. Experimental location results are shown in Table 2. Simulation results are shown in Table 3, which differ slightly from the experimental results.

TABLE 2 fault location results

| Fault types Fault resistance ($\Omega$) | Single-phase to ground fault | | | Double-phase fault | | | Double-phase to ground fault | | |
|---|---|---|---|---|---|---|---|---|---|
|  | 0 | 10 | 25 | 0 | 10 | 25 | 0 | 10 | 25 |
| Type I | 121 | 119 | 117 | 118 | 118 | 116 | 123 | 117 | 117 |
| Type II | 13 | 15 | 17 | 16 | 16 | 18 | 11 | 17 | 17 |

TABLE 3 fault location results of the simulation

| Fault types Fault resistance ($\Omega$) | Single-phase to ground fault | | | Double-phase fault | | | Double-phase to ground fault | | |
|---|---|---|---|---|---|---|---|---|---|
|  | 0 | 10 | 25 | 0 | 10 | 25 | 0 | 10 | 25 |
| Type I | 121 | 121 | 123 | 125 | 123 | 123 | 123 | 124 | 123 |
| Type II | 13 | 13 | 11 | 9 | 11 | 10 | 11 | 10 | 11 |

The numeric results shown in Table 2 indicate the amounts of different location results. The correct location percentages range from 90.30% to 93.28%. The erroneous location is deemed to be affected by the parameters of lines. This implies that if the impedance of the faulted line is much smaller (about ⅓₀) than the adjacent line impedance, location tends to be identified incorrectly. Furthermore, the failing can be avoided by adding IEDs, according to the statistical results.

Figure 7:
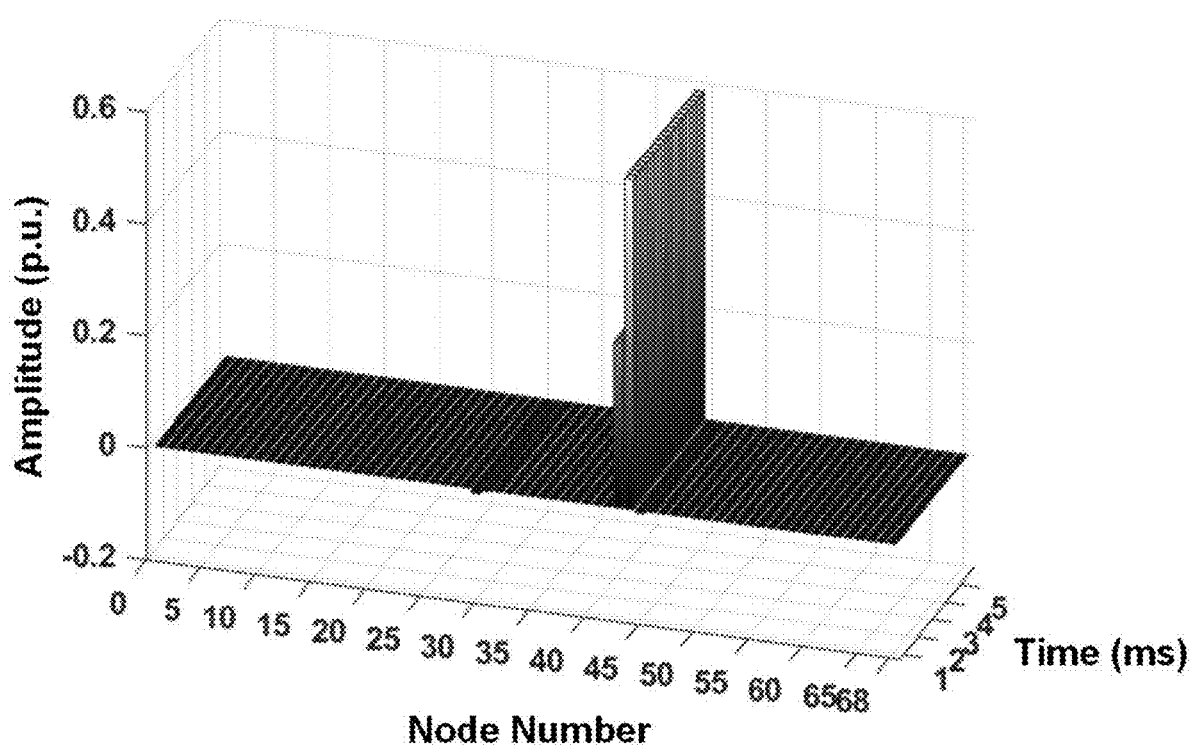
FIG. 7 shows an example location result of a double-phase to ground fault according to an embodiment of the present disclosure.

One of the location cases is that a double-phase to ground fault with a fault resistance of 25Ω occurs between nodes 43 and 44, and the location result is illustrated in FIG. 7. The node number is plotted on the X-axis, the time is plotted on the Y-axis, and the elements value of $I^*_F$ is plotted on the vertical Z-axis against the XY plane (a data sampling window of 5 ms with a 4 kHz sampling frequency). FIG. 7 shows that there are only two nonzero values at node numbers 43 and 44 during the sampling time, indicating that the location result is correct.

The vertical axis (i.e., Amplitude) in FIG. 7 shows the computing values of virtual currents, the ordinate (i.e., Time) shows the time where the starting point refers to the starting of sampling (e.g., 0.75 ms after fault occurrence), and the axis of abscissae (i.e., Node Number) shows the nodes numbers. FIGS. 8-13 will be depicted in the same way.

B. Influence of Noise

Measurement accuracy may be affected by noises generated by environmental factors. In this subsection, the performance of the disclosed method is studied under noise. The location results of experimental tests with 30 dB Gaussian white noise added in measured voltages are shown in Table 4. The corresponding simulation results are shown in Table 5.

TABLE 4 experimental fault location results under noise condition

| Fault types Fault resistance | Single-phase to ground fault | | | Double-phase fault | | | Double-phase to ground fault | | |
|---|---|---|---|---|---|---|---|---|---|
| (Ω) | 0 | 10 | 25 | 0 | 10 | 25 | 0 | 10 | 25 |
| Type I | 112 | 111 | 109 | 110 | 114 | 110 | 118 | 109 | 105 |
| Type II | 22 | 23 | 25 | 24 | 20 | 24 | 16 | 25 | 29 |

TABLE 5 simulation fault location results under noise condition

| Fault types Fault resistance | Single-phase to ground fault | | | Double-phase fault | | | Double-phase to ground fault | | |
|---|---|---|---|---|---|---|---|---|---|
| (Ω) | 0 | 10 | 25 | 0 | 10 | 25 | 0 | 10 | 25 |
| Type I | 110 | 112 | 110 | 110 | 116 | 112 | 114 | 114 | 116 |
| Type II | 24 | 22 | 24 | 24 | 18 | 22 | 20 | 20 | 18 |

The numeric results in Table 4 match those presented in Table 3. Table 4 shows that, in response to 30 dB noise, the disclosed method can still obtain the fault location. In this example, the error of voltage measurement devices is mostly below 0.1-0.5%. Therefore, the anti-noise ability of the disclosed method can meet the requirement of practical application. The BCS algorithm may provide the main contribution to decrease the effect of noise. As its superiority, BCS algorithm considers noise; therefore, not only the negative sequence current but also the noise can be estimated simultaneously with the iteration of the algorithm. This ability makes the BCS algorithm very robust, which is also why this disclosure chose the BCS algorithm instead of other CS algorithms.

Figure 8:
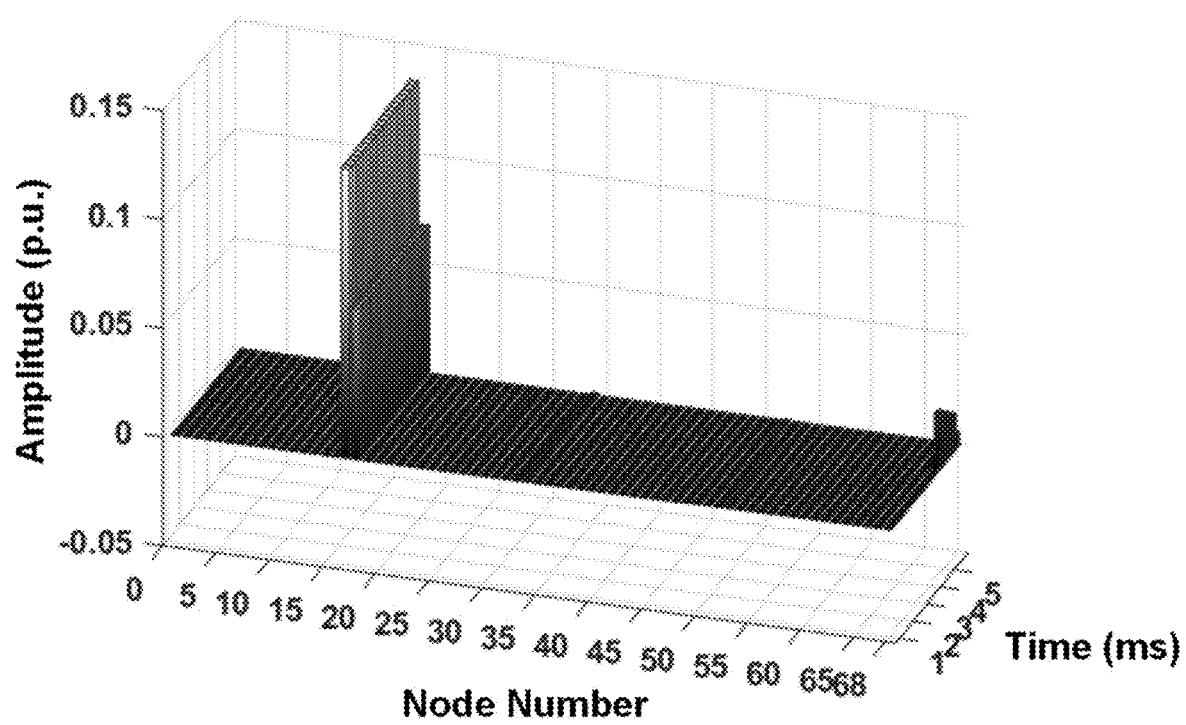
FIG. 8 shows an example location result of a single-phase to ground fault according to an embodiment of the present disclosure.

One of the location cases is that a single-phase to ground fault with a fault resistance of 10Ω occurred between nodes 17 and 18 in response to 30 dB noise, the reconstructed result $r^*_F$ is illustrated in FIG. 8. The fault can be determined to have occurred between nodes 17 and 18.

C. Influence of Load and Line Parameter Alteration

The load and line parameters are relevant to the impedance matrix. Therefore, it may be necessary to measure their impact on the disclosed method. Loads may fluctuate between 80% and 120% of the original value. In this example, the disclosed method is tested under the different load conditions. Experimental results of double-phase to ground fault under the changing load condition is shown in Table 6; which demonstrates that slight changes in load may abate the correct-location rate. The corresponding simulation results are shown in Table 7.

TABLE 6 experimental fault location results of double phase to ground fault with load change

| Total load/Original load | 80% | 90% | 100% | 120% |
|---|---|---|---|---|
| Type I | 105 | 115 | 123 | 117 |
| Type II | 29 | 29 | 11 | 17 |

TABLE 7 simulation fault location results of double phase to ground fault with load change

| Total load/Original load | 80% | 90% | 100% | 120% |
|---|---|---|---|---|
| Type I | 118 | 117 | 123 | 118 |
| Type II | 16 | 17 | 11 | 16 |

The numeric results shown in Table 6 have been obtained identically as in Table 2. The factor of line parameters has been studied in the same way. With the parameters of each line arbitrarily adjusted from about 0.9 to about 1.1 times of the original values, most cases are not affected except for few cases that have been identified as Type II, which could be overcome if extra IEDs were to be added near the faulted section.

Figure 9:
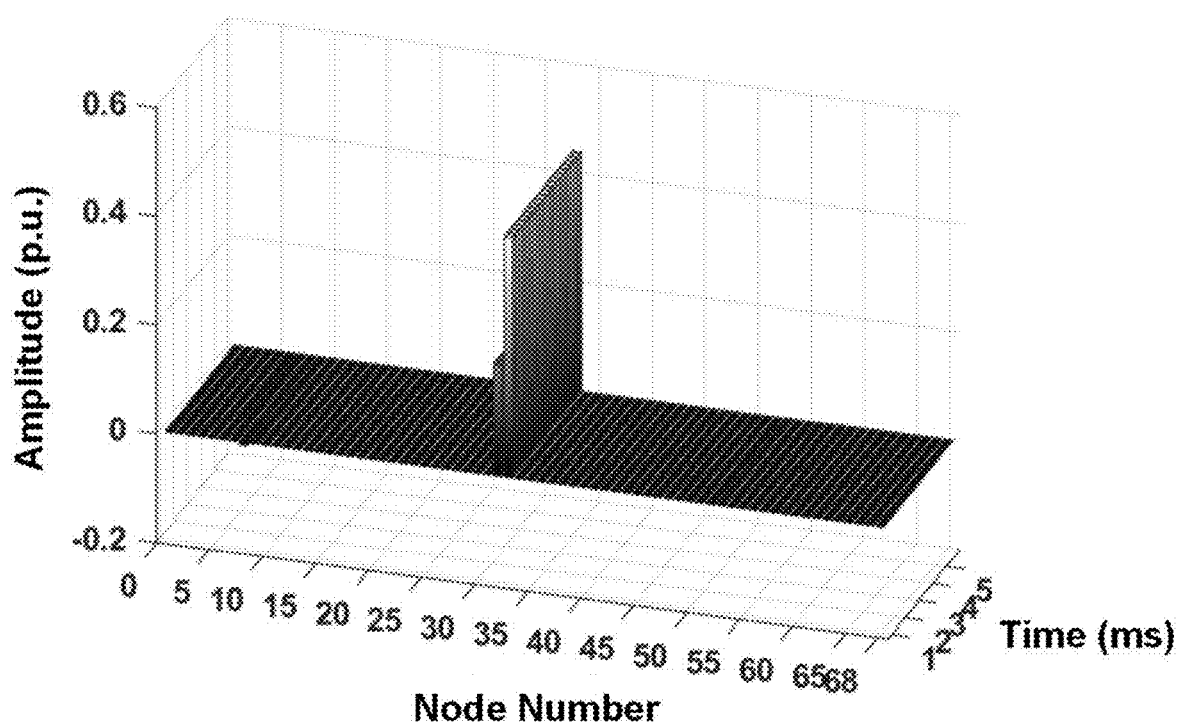
FIG. 9 shows an example location result of a double-phase fault according to an embodiment of the present disclosure.

One of the location cases is that a double-phase fault occurs between nodes 32 and 33, at a fault resistance of 10Ω, with the line parameters modified by the above procedure. The reconstructed result i; is shown in FIG. 9, from which the faulted section can be correctly identified.

D. Influence of Unbalanced Condition

Distribution networks are normally unbalanced among three phases. In this subsection, the performance of the disclosed method under the unbalanced condition is described. It should be noted that the unbalanced condition in the high- and middle-voltage (e.g., above 10 kV) distribution networks, as studied in this disclosure, may be caused by the connected asymmetrical loads instead of the grid itself.

Figure 10:
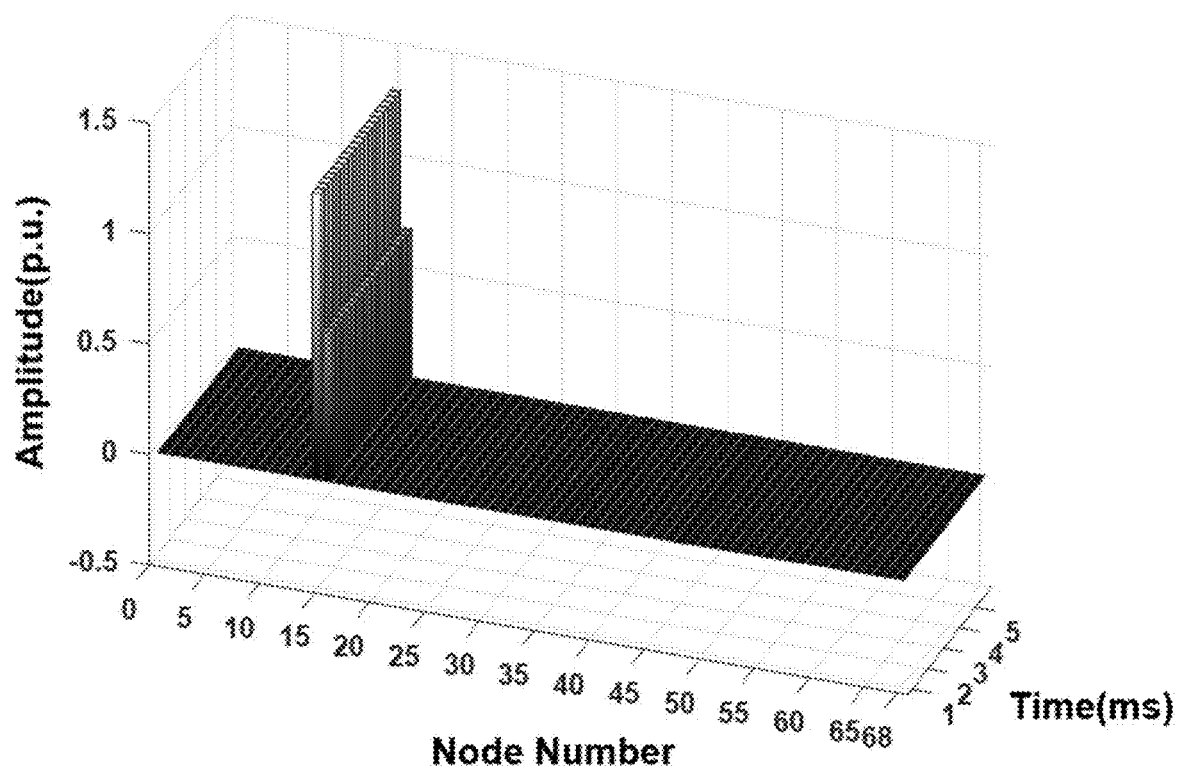
FIG. 10 shows an example location result of a fault according to an embodiment of the present disclosure.
Figure 11:
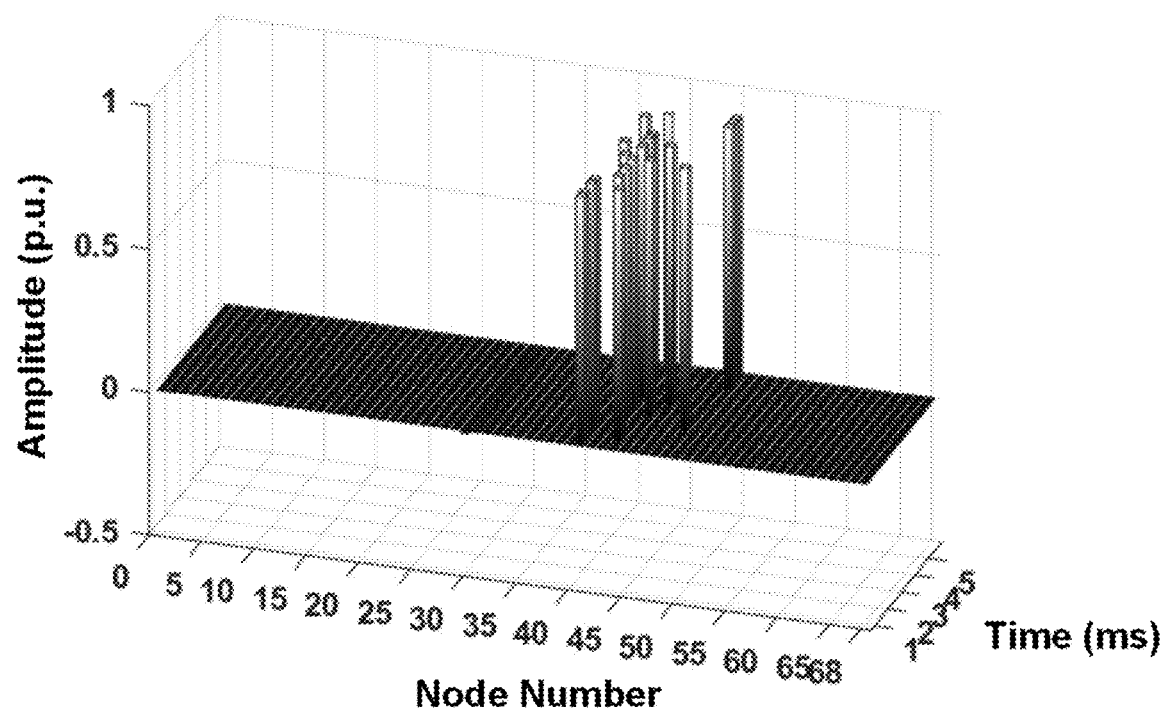
FIG. 11 shows an example location result of a double-phase to ground fault according to an embodiment of the present disclosure.

To imitate the unbalanced condition, the largest loads connected to nodes 49, 38, 37, 52, 10, 11, 20, 15, 59, and 36 have been adjusted by increasing the load of an arbitrary phase by 20%. The allocation of IEDs, fault positions, and other settings remain the same. The results of the simulation and experimental tests validate that the disclosed method performs effectively and achieves high-accuracy. FIG. 10 shows the location result of a case where a double-phase to ground fault occurs on the line 15-16 under an unbalanced condition.

The experimental tests indicate that the disclosed method works normally in networks where a tri-phase unbalance percentage is below 20%. In extremity, such as if one phase of the load is lost, the disclosed method might be affected.

E. Influence of the IED Allocation

According to the analysis in the subsection B of section II, it is essential that at least one IED is allocated respectively upstream and downstream of a faulted area to guarantee validity of the disclosed method. If this allocation cannot be satisfied, the fault location method disclosed herein may decrease correctness. In this subsection, the influence of IED allocation is investigated.

For the case mentioned in the subsection A of section III, the location result is correct as shown in FIG. 4 with original IED allocation (i.e., installed at nodes 1, 26, 34, 38, 40, 53, 55, 57, and 68). Then, the IED is installed at node 53 to node 41 and the result is shown as FIG. 11, which is a false location. Therefore, it is recommended that an IED be allocated at the end of a network branch closest to a power supply.

In addition to the IED allocation, the minimum number of IEDs may also be required. According to the theory of BCS, the minimum number of IEDs should satisfy the inequality (37) to guarantee the feasibility of sparse reconfiguration:

$$M \geq K \ln\left(\frac{N}{K}\right) \quad (37)$$

where K represents the possible number of non-zero elements of $I^*_F$, N represents the number of nodes, and M represents the number of IEDs in the network. In the PG&E 69-nodes system 400, dimension of $I^*_F$; is 68 (excluding the reference node), and the number of non-zero elements is generally 2. It can be obtained from the equation (37) that at least seven IEDs are needed for the disclosed method. However, there are nine distributaries in the system 400; therefore, at least nine IEDs are needed in total. In summary, the IED allocation installed at nodes 1, 26, 34, 38, 40, 53, 55, 57, and 68 can fulfil the location requirement.

F. Influence of Harmonics

In theory, the disclosed method uses the negative-sequence impedance matrix and voltages to estimate the fault location which are derived from the fundamental frequency component. Therefore, harmonics may not affect fault location. To verify this assertion, a harmonics condition has been emulated in the modified PG&E 69-nodes distribution system in PSCAD/EMTDC. One harmonic source is connected at node 49 and the current magnitude of the 5th harmonic order (250 Hz) is set as 1A.

Figure 12:
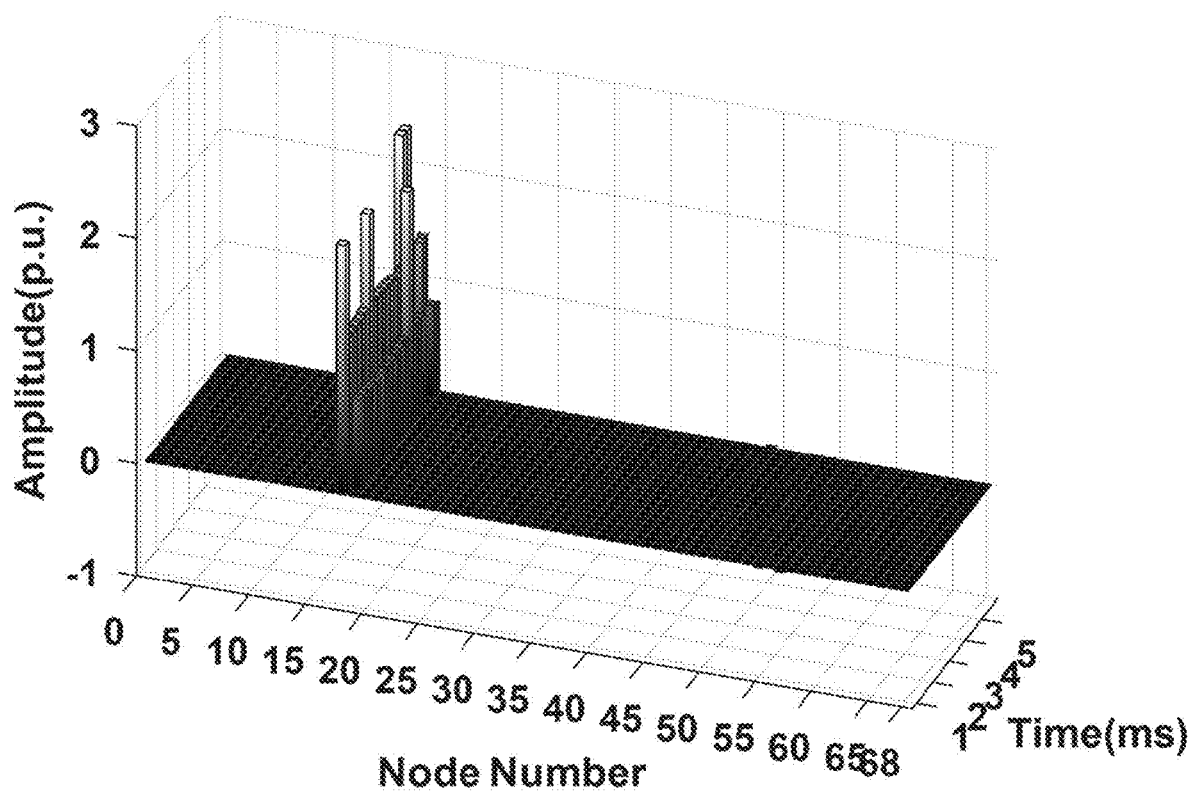
FIG. 12 shows an example location result of a double-phase to ground fault according to an embodiment of the present disclosure.

FIG. 12 shows that the simulation results indicate that the harmonics do not affect the disclosed method. The location results of other cases retain the condition as depicted in Table 2.

G. Influence of Photovoltaic (PV) Power Plant

In this subsection, the effect of inverter interfaced DGs is studied. For convenience, only one PV power plant is involved in this example.

The control strategy of PV is generally to suppress the negative-sequence injected current for smooth fault ride through (FRT). Therefore, it seems that access of PV would not make any difference to the disclosed method. In fact, negative-sequence currents are outputted from PV inverters. However, the currents are rather small compared to the fault negative current; therefore, this suggests that PV will not impact the fault location method disclosed herein. To verify this, three 1MW-PV power stations are connected to nodes 29, 31, and 45, respectively.

Figure 13:
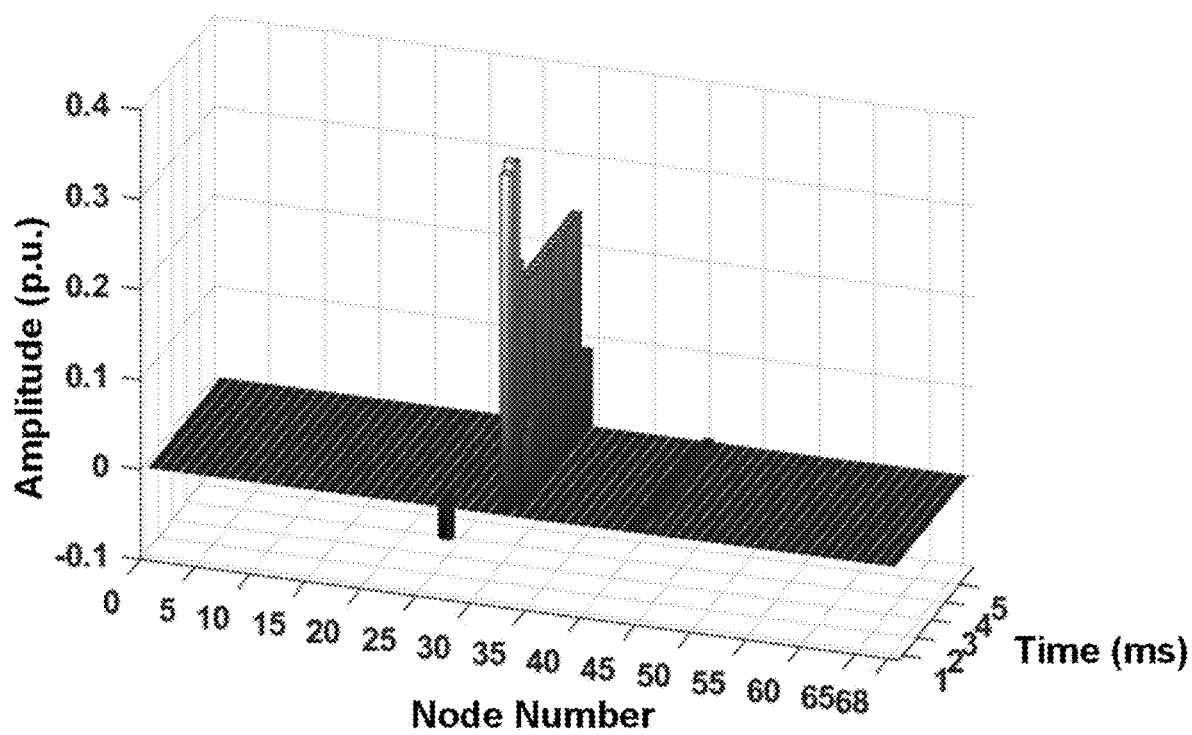
FIG. 13 shows an example location result of a double-phase to ground fault according to an embodiment of the present disclosure.

For the case that a double-phase fault with a fault resistance of 25Ω occurs between nodes 32 and 33, $I^*_F$ is as shown in FIG. 13. Although the access of the PV influences the reconstruction result, the faulted section can still be correctly identified.

H. Discussion of Threshold of Reconstructed Virtual Currents

Additional discussion upon the threshold of the reconstructed virtual currents, i.e. the amplitudes in FIGS. 7-13 is presented in this subsection.

Regarding the reconstructed result two nonzero items of the vector should be relative to both nodes of the identified faulted line section. Supposing that there are more than two nonzero items in the vector, it is significant to decide which two nonzero items should be taken as nodes corresponding to the faulted section. To distinguish the two nonzero items from the others, a diversity factor between these two nonzero items and the other nonzero items is used as threshold in this example. The diversity factor may be a differential degree that is defined as a ratio of the lower value of the biggest two nonzero items and the highest value of other nonzero items. For a specific case, if the differential degree is obtained above a certain threshold, the location result can be identified from $I^*_F$.

Figure 14:
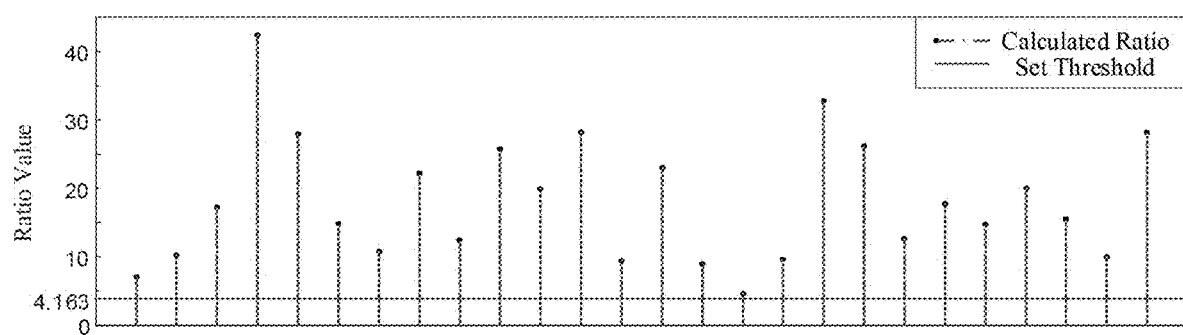
FIG. 14 shows example calculated ratios of currents and a ratio threshold according to an embodiment of the present disclosure.

In FIG. 14, the ordinate shows ratios of the lower value of the biggest two nonzero items and the highest value of other nonzero items, and the abscissae shows the different conditions. As shown in the statistical chart in FIG. 14, the minimum differential degree is about 4.626. In consideration of error, the threshold can be defined as 4.163, which equals the minimum ratio multiplied by a coefficient 0.9 to distinguish all valid results from the invalid. Therefore, the set threshold 4.163 indicates that only if the differential degree of values in a location result is above 4.163 the result could be considered as discernible and valid.

In this disclosure, a sparse measurements-based fault-section location method aimed at asymmetrical faults is provided. This method can be applicable to distribution networks with DGs. Utilizing the amplitudes simplifies the algorithm, and the feasibility of the simplification has been demonstrated. To reconstruct $I^*_F$ through sparse measurements, the theory of BCS is introduced to solve the underdetermined function. The advantages of the disclosed method verified by experimental tests and simulation results can be summarized as follows. The disclosed method provides robust fault location results under a variety of asymmetrical fault scenarios. Big fault resistance (e.g., 100Ω) and high noisy (e.g., 30 dB) do not invalidate the method. Slight changes of line and load parameters do not invalidate the method. Few IEDs allocated in the terminal buses are needed for the fault location; therefore, the implementation cost is low. The IED location can be optimized in the methodology, which is verified in the simulation. The disclosed system and method can be applicable with the introduction of inverter interfaced DGs, which shows the engineering value of this method.

IV. Technical Implementation of the Disclosed Method

Figure 15:
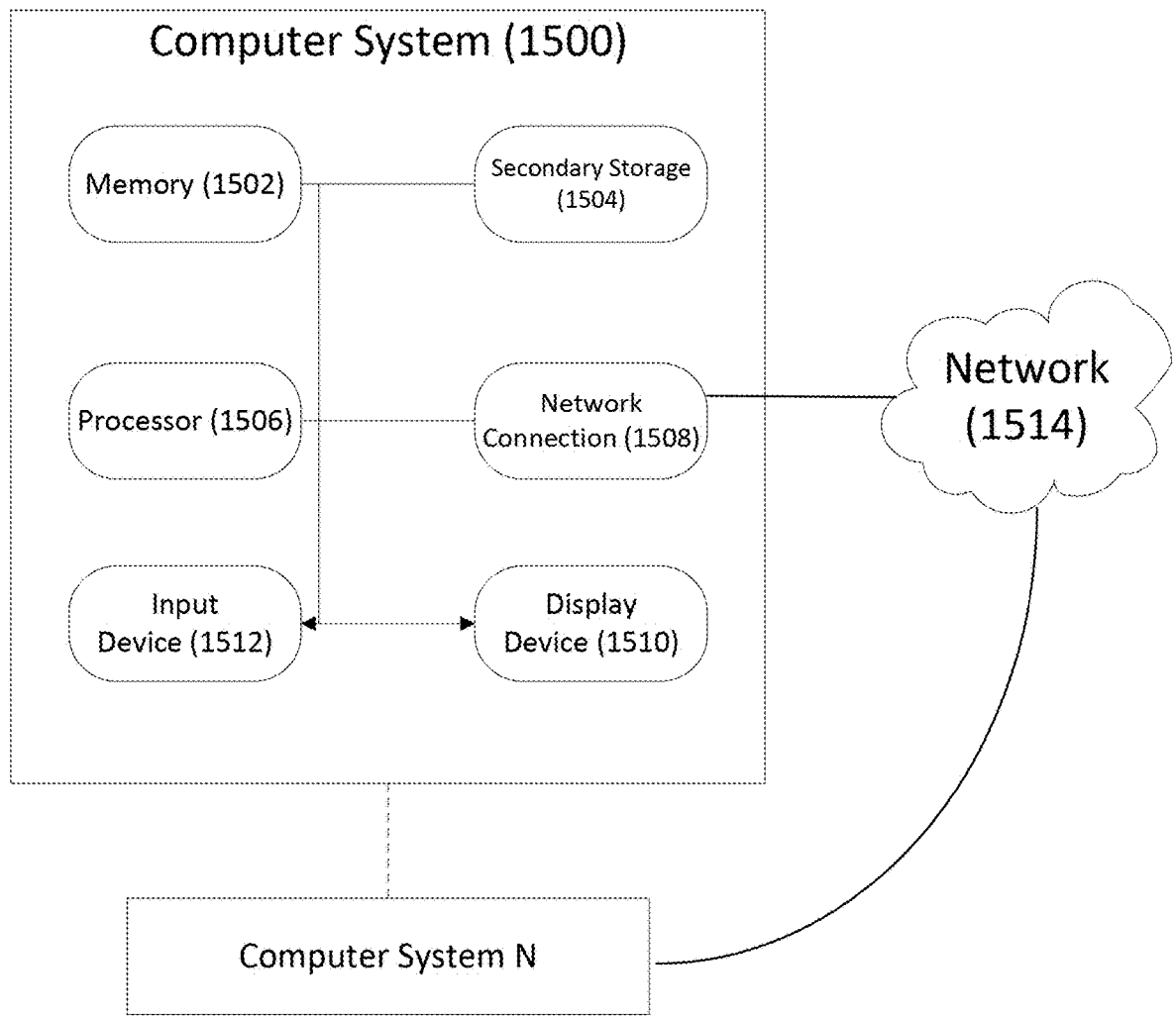
FIG. 15 shows a computer system that may implement a disclosed distance protection method according to an embodiment of the present disclosure.

In some embodiments, the fault location system and method disclosed herein may comprise a computer system to implement the disclosed fault location method. The computer system may act as a controller to control executions of, for example, the flow chart of the fault location method 300 in FIG. 2, the experimental test system 600 in FIG. 6, and various other calculations and simulations disclosed herein. FIG. 15 illustrates an exemplary computer system 1500 that can be used to implement the disclosed method partially or wholly. The computer system 1500, or other computer systems similarly configured, may include and execute one or more subsystem components to perform functions described herein, including the steps/blocks of various flow processes, measurements and/or analyses described above. Likewise, a mobile device, a cell phone, a smartphone, a laptop, a desktop, a notebook, a tablet, a wearable device, a server, etc., which includes some of the same components of the computer system 1500, may run an application (or software) and perform the steps and functionalities described above. The computer system 1500 may connect to a network 1514, e.g., Internet, or other network, to receive inquiries, obtain data, and/or transmit information as described above.

The computer system 1500 typically includes a memory 1502, a secondary storage device 1504, and a processor 1506. The computer system 1500 may also include a plurality of processors 1506 and be configured as a plurality of, e.g., bladed servers, or other known server configurations. The computer system 1500 may also include a network connection device 1508, a display device 1510, and an input device 1512.

The memory 1502 may include RAM or similar types of memory, and it may store one or more applications for execution by the processor 1506. The secondary storage device 1504 may include a hard disk drive, floppy disk drive, CD-ROM drive, or other types of non-volatile data storage. The processor 1506 executes the application(s), such as those described herein, which are stored in the memory 1502 or secondary storage 1504, or received from the Internet or other network 1514. The processing by processor 1506 may be implemented in software, such as software modules, for execution by computers or other machines. These applications preferably include instructions executable to perform the system and subsystem component functions and methods described above and illustrated in the Figures herein. The applications preferably provide graphical user interfaces (GUIs) through which users may view and interact with the subsystem components.

The computer system 1500 may store one or more database structures in the secondary storage 1504, for example, for storing and maintaining the information/data necessary to perform the above-described functions. Alternatively, such information/data may be in storage devices separate from these components.

Also, as noted, the processor 1506 may execute one or more software applications to provide the functions described in this specification, specifically to execute and perform the steps and functions in the process flows, measurements and/or analyses described above. The GUIs may be formatted, for example, as web pages in HyperText Markup Language (HTML), Extensible Markup Language (XML) or in any other suitable form for presentation on a display device depending upon applications used by users to interact with the computer system 1500.

The input device 1512 may include any device for entering information into the computer system 1500, such as a touch-screen, keyboard, mouse, cursor-control device, microphone, digital camera, video recorder or camcorder. The input and output device 1512 may be used to enter information into GUIs during performance of the methods described above. The display device 1510 may include any type of device for presenting visual information such as, for example, a computer monitor or flat-screen display (or mobile device screen). The display device 1510 may display the GUIs and/or output from sub-system components (or software).

Examples of the computer system 1500 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1500 is shown in detail, the computer system 1500 may use multiple computer systems or servers as necessary or desired to support the users and may also use back-up or redundant servers to prevent network downtime in the event of a failure of a particular server. In addition, although the computer system 1500 is depicted with various components, one skilled in the art will appreciate that the computer system 1500 can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1500, to perform a particular method, such as methods described above.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one embodiment," or "in one implementation" does not necessarily refer to the same example, embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A sparse voltage measurement-based fault location determination system in an alternating current (AC) distribution network, wherein the AC distribution network comprises:

a plurality of nodes, an end node of the plurality of nodes being connected to an upper stage grid via a transformer substation;

a plurality of inverter interfaced distributed generations (IIDGs), each of the plurality of IIDGs being connected to a node via a DC/AC inverter; and a plurality of intelligent electronic devices (IEDs), each of the plurality of IEDs being disposed at an end node of the plurality nodes for sampling and measuring voltage of that end node, wherein the number of the plurality of IEDs is less than the number of the plurality of nodes, such that the plurality of IEDs are sparse with respect to the plurality of nodes, the sparse voltage measurement-based fault locating system comprises a controller in data communication with the AC distribution network, the controller configured to:

determine a first negative sequence impedance matrix of the AC distribution network based on network parameters and load parameters of the AC distribution network, wherein the first negative sequence impedance matrix is obtained by reversing an admittance matrix of the AC distribution network;

extract a second negative sequence impedance matrix from the first negative sequence impedance matrix based on allocations of the plurality of IEDs, wherein the number of rows of the second negative sequence impedance matrix equals the number of the plurality of IEDs;

determine a negative sequence impedance amplitude matrix from the second negative sequence impedance matrix, wherein each element of the negative sequence impedance amplitude matrix is an amplitude value of each corresponding element of the second negative sequence impedance matrix;

when a fault is detected to have occurred in the AC distribution network, determine a negative sequence voltage vector, each element of the negative sequence voltage vector being a voltage of a node at which one of the plurality of IEDs is disposed, and the voltage of the node being sampled and measured by the corresponding IED at a specified sampling frequency over a specified sampling time period;

determine a negative sequence voltage amplitude vector from the negative sequence voltage vector by calculating an amplitude of each voltage in the negative sequence voltage vector;

perform a Bayesian compressive sensing (BCS) operation on the negative sequence impedance amplitude matrix determined from the second negative sequence impedance matrix and the negative sequence voltage amplitude vector to obtain a reconstructed negative sequence current vector, wherein each element of the reconstructed negative sequence current vector is a virtual current at a node of the plurality of nodes, each element of the reconstructed negative sequence current vector is an amplitude value of a corresponding current, and the reconstructed negative sequence current vector has few nonzero elements such that the reconstructed negative sequence current vector is a sparse vector;

identify two nodes corresponding to the first two largest elements in the reconstructed negative sequence current vector; and determine the fault to have occurred between the two nodes corresponding to the first two largest elements.

* * * * *